US011328756B1

(12) United States Patent
Choi et al.

(10) Patent No.: US 11,328,756 B1
(45) Date of Patent: May 10, 2022

(54) SEMICONDUCTOR DEVICE AND SEMICONDUCTOR SYSTEM PERFORMING AUTO-PRECHARGE OPERATION

(71) Applicant: SK hynix Inc., Icheon-si (KR)

(72) Inventors: Geun Ho Choi, Icheon-si (KR); Ki Hun Kwon, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 17/229,133

(22) Filed: Apr. 13, 2021

(30) Foreign Application Priority Data

Dec. 16, 2020 (KR) .......................... 10-2020-0176042

(51) Int. Cl.
    *G11C 7/22*      (2006.01)
    *G06F 12/06*     (2006.01)
    *G11C 8/18*      (2006.01)

(52) U.S. Cl.
    CPC .......... *G11C 7/222* (2013.01); *G06F 12/0646* (2013.01); *G11C 8/18* (2013.01)

(58) Field of Classification Search
    CPC ........ G11C 7/222; G11C 8/18; G06F 12/0646

USPC ........................................................ 711/154
See application file for complete search history.

(56) References Cited

U.S. PATENT DOCUMENTS 9,672,883 B1 * 6/2017 Lee ........................... G11C 7/22
2019/0371390 A1   12/2019 Ito

FOREIGN PATENT DOCUMENTS

CN     103092785 A  *  5/2013
KR    1020110097478 A    8/2011

* cited by examiner

*Primary Examiner* — Fernando Hidalgo
(74) *Attorney, Agent, or Firm* — William Park & Associates Ltd.

(57) ABSTRACT

A semiconductor system includes a controller configured to output a clock, a command and an address; and a semiconductor device configured to generate a flag signal by detecting an input time of the command, which is input in synchronization with the clock in a write auto-precharge operation based on the command, and configured to generate an internal address for performing the write auto-precharge operation, by serializing the address and then parallelizing the flag signal and the serialized address.

23 Claims, 23 Drawing Sheets

FIG. 22

| OPERATION | CS | CA<1> | CA<2> | CA<3> | CA<4> | CA<5> | CA<6> | CA<7> | CA<8> | CA<9> |
|---|---|---|---|---|---|---|---|---|---|---|
| WRITE AUTO PRECHARGE | L | H | L | H | H | L | BA<1> | BA<2> | BG<1> | BG<2> |
| | H | COL<1> | COL<2> | X | X | X | X | X | X | H or L |
| READ AUTO PRECHARGE | L | H | L | H | H | H | BA<1> | BA<2> | BG<1> | BG<2> |
| | H | COL<1> | COL<2> | X | X | X | X | X | X | H or L |

SEMICONDUCTOR DEVICE AND SEMICONDUCTOR SYSTEM PERFORMING AUTO-PRECHARGE OPERATION

CROSS-REFERENCE TO RELATED APPLICATION

The present application claims priority under 35 U.S.C. § 119(a) to Korean Patent Application No. 10-2020-0176042 filed on Dec. 16, 2020 in the Korean Intellectual Property Office, which is incorporated herein by reference in its entirety.

BACKGROUND

1. Technical Field

Embodiments of the present disclosure relate to a semiconductor device and a semiconductor system, which serialize addresses depending on a time when a command is input and perform an auto-precharge operation through internal addresses generated by parallelizing the serialized addresses.

2. Related Art

In general, a semiconductor device with a DDR SDRAM (double data rate synchronous DRAM) performs data read and write operations according to commands that are input from an external chipset. In order to perform such read and write operations, the semiconductor device should perform an active operation. The semiconductor device generates an active command and internal addresses to perform the active operation, based on a command and addresses that are input through command address pins. The command and the addresses, which are continuously input, may be distinguished by using a chip select signal.

Meanwhile, the semiconductor device supports a write auto-precharge operation and a read auto-precharge operation in which a precharge operation is automatically performed after a write operation and a read operation.

SUMMARY

In an embodiment, a semiconductor device may include: a control circuit configured to generate first to fourth shifting rising clocks and first to third shifting falling clocks by shifting a first write command and a second write command that are selectively generated based on an input time of a command in a write auto-precharge operation; and an internal address generation circuit configured to generate first and second internal bank group addresses, first and second internal bank addresses and first and second internal column addresses for performing the write auto-precharge operation, by serializing and then parallelizing first and second bank group addresses, first and second bank addresses and first and second column addresses in synchronization with the first to fourth shifting rising clocks and the first to third shifting falling clocks.

In an embodiment, a semiconductor system may include: a controller configured to output a clock, a command and an address; and a semiconductor device configured to generate a flag signal by detecting an input time of the command, which is input in synchronization with the clock in a write auto-precharge operation based on the command, and configured to generate an internal address for performing the write auto-precharge operation by serializing the address and then parallelizing the flag signal and the serialized address.

In an embodiment, a semiconductor system may include: a controller configured to output a clock, a chip select signal and a command address; and a semiconductor device configured to generate first and second bank group addresses and first and second bank addresses from the command address that is input during a period in which the chip select signal is a first logic level when the command address that is input during the period in which the chip select signal is the first logic level is a logic level combination for performing a write auto-precharge operation, configured to generate first and second column addresses from the command address that is input during a period in which the chip select signal is a second logic level, and configured to generate first and second internal bank group addresses, first and second internal bank addresses and first and second internal column addresses by serializing and then parallelizing the first and second bank group addresses, the first and second bank addresses, and the first and second column addresses.

BRIEF DESCRIPTION OF THE DRAWINGS

FIG. 22 is a table to assist in the explanation of a chip select signal and command addresses for controlling the operation of the semiconductor system illustrated in FIG. 20.

DETAILED DESCRIPTION

Figure 1:
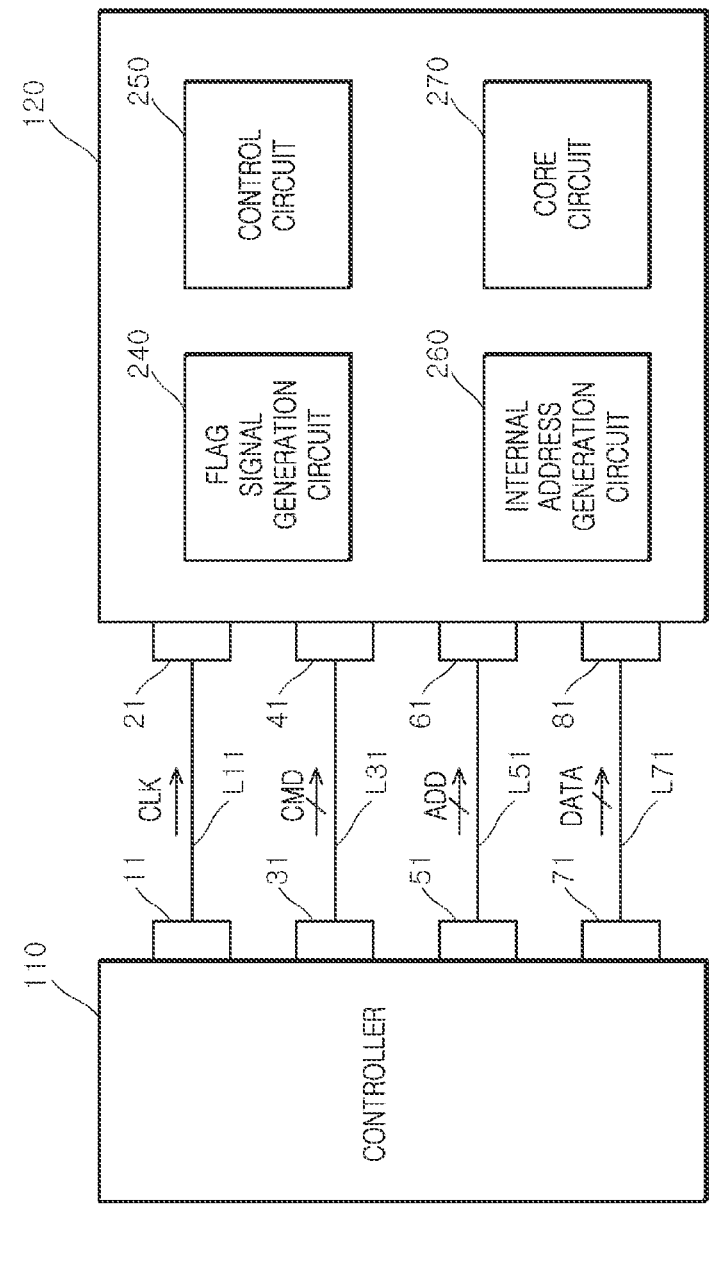
FIG. 1 is a block diagram illustrating a configuration of a semiconductor system in accordance with an embodiment of the disclosure.

The term "preset" means that the numerical value of a parameter is predetermined when the parameter is used in a process or algorithm. Depending on an embodiment, the numerical value of a parameter may be set when a process or algorithm starts or may be set during a period in which the process or algorithm is executed.

Terms such as "first" and "second" used to distinguish various components are not limited by components. For example, a first component may be named as a second component, and conversely, the second component may be named as the first component.

When it is described that one component is "coupled" or "connected" to another component, it is to be understood that the one component may be coupled or connected to another component directly or by the medium of still another component. On the other hand, the descriptions of "directly coupled" or "directly connected" should be understood to mean that one component is coupled or connected to another component directly without intervention of a still another component.

"Logic high level" and "logic low level" are used to describe logic levels of signals. A signal with a "logic high level" is distinguished from a signal with a "logic low level." For example, when a signal with a first voltage corresponds to a "logic high level," a signal with a second voltage may correspond to a "logic low level." Depending on an embodiment, a "logic high level" may be set to a voltage higher than a "logic low level." Meanwhile, depending on an embodiment, logic levels of signals may be set to different logic levels or opposite logic levels. For example, depending on an embodiment, a signal with a logic high level may be set to have a logic low level, and a signal with a logic low level may be set to have a logic high level.

Hereinafter, various examples of embodiments of the disclosure will be described in detail with reference to the accompanying drawings. These embodiments are only for illustrating the disclosure, and the scope of protection of the disclosure is not limited by these embodiments.

Various embodiments are directed to a semiconductor device and a semiconductor system, which serialize addresses based on the time at which each command and command address is input and then generate internal addresses by parallelizing the serialized addresses, thereby performing a write auto-precharge operation and a read auto-precharge operation.

According to the embodiments of the disclosure, it is possible to serialize addresses based on the time at which each command and command address is input and then to generate internal addresses by parallelizing the serialized addresses, thereby performing a write auto-precharge operation and a read auto-precharge operation.

Also, according to the embodiments of the disclosure, by serializing addresses that are input in parallel and then generating internal addresses by parallelizing the serialized addresses, it is possible to reduce the number of flip-flops for latching and shifting addresses, and thus, reduce the area.

As illustrated in FIG. 1, a semiconductor system 100 in accordance with an embodiment of the disclosure may include a controller 110 and a semiconductor device 120. The semiconductor device 120 may include a flag signal generation circuit 240, a control circuit 250, an internal address generation circuit 260, and a core circuit 270.

The controller 110 may include a first control pin 11, a second control pin 31, a third control pin 51, and a fourth control pin 71. The semiconductor device 120 may include a first semiconductor pin 21, a second semiconductor pin 41, a third semiconductor pin 61, and a fourth semiconductor pin 81. A first transmission line 11 may be coupled between the first control pin 11 and the first semiconductor pin 21. A second transmission line L31 may be coupled between the second control pin 31 and the second semiconductor pin 41. A third transmission line L51 may be coupled between the third control pin 51 and the third semiconductor pin 61. A fourth transmission line L71 may be coupled between the fourth control pin 71 and the fourth semiconductor pin 81. The controller 110 may transmit a clock CLK to the semiconductor device 120 through the first transmission line L11 in order to control the semiconductor device 120. The controller 110 may transmit a command CMD to the semiconductor device 120 through the second transmission line L31 in order to control the semiconductor device 120. The controller 110 may transmit an address ADD to the semiconductor device 120 through the third transmission line L51 in order to control the semiconductor device 120. The controller 110 and the semiconductor device 120 may transmit and receive data DATA through the fourth transmission line L71.

The controller 110 may output the clock CLK, the command CMD, the address ADD, and the data DATA to the semiconductor device 120 for performing a write auto-precharge operation. The write auto-precharge operation may be set as an operation of automatically performing a precharge operation after a write operation of the semiconductor device 120.

The flag signal generation circuit 240 may generate a flag signal FLAG (see FIG. 2) with information on an input time of the command CMD. The flag signal generation circuit 240 may generate the flag signal FLAG (see FIG. 2) which is disabled, when the command CMD is input in synchronization with the rising edge of the clock CLK. The flag signal generation circuit 240 may generate the flag signal FLAG (see FIG. 2) that is enabled when the command CMD is input in synchronization with the falling edge of the clock CLK.

Figure 2:
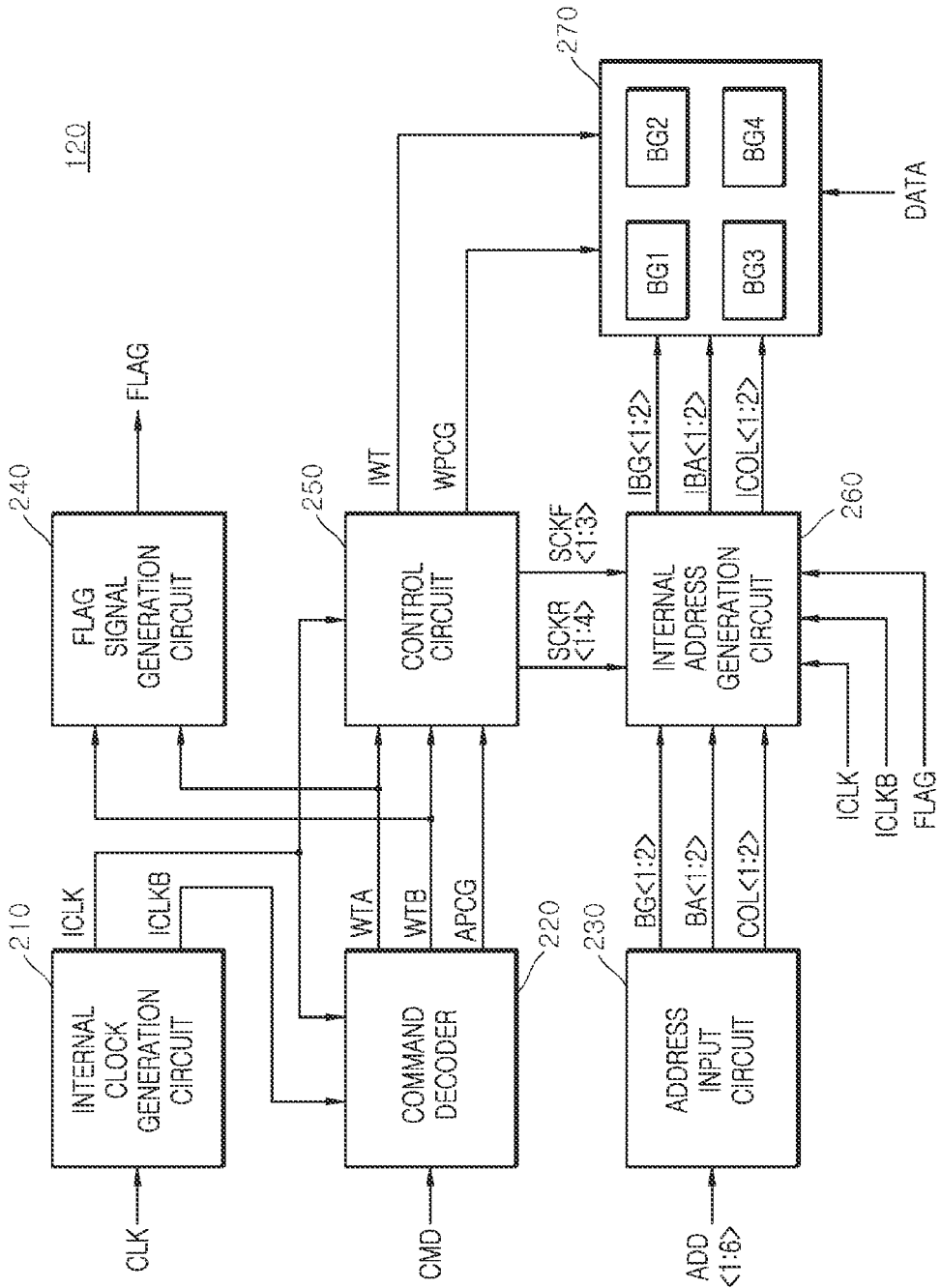
FIG. 2 is a block diagram illustrating a configuration of a semiconductor device included in the semiconductor system illustrated in FIG. 1.

The control circuit 250 may shift a first write command WTA (see FIG. 2) and a second write command WTB (see FIG. 2) that are generated by the command CMD, and thereby, may generate first to fourth shifting rising clocks SCKR<1:4> (see FIG. 2) and first to third shifting falling clocks SCKF<1:3> (see FIG. 2).

The internal address generation circuit 260 may serialize the address ADD based on the first to fourth shifting rising clocks SCKR<1:4> (see FIG. 2) and the first to third shifting falling clocks SCKF<1:3> (see FIG. 2). The internal address generation circuit 260 may parallelize the flag signal FLAG (see FIG. 2) and the serialized address ADD, and thereby, may generate first and second internal bank group addresses IBG<1:2> (see FIG. 2), first and second internal bank addresses IBA<1:2> (see FIG. 2), and first and second internal column addresses ICOL<1:2> (see FIG. 2).

The core circuit 270 may perform the write auto-precharge operation based on the first and second internal bank group addresses IBG<1:2> (see FIG. 2), the first and second internal bank addresses IBA<1:2> (see FIG. 2), and the first and second internal column addresses ICOL<1:2> (see FIG. 2) after the write operation.

FIG. 2 is a block diagram illustrating a configuration of the semiconductor device 120 in accordance with the embodiment of the disclosure. As illustrated in FIG. 2, the semiconductor device 120 may include an internal clock generation circuit 210, a command decoder 220, an address input circuit 230, the flag signal generation circuit 240, the control circuit 250, the internal address generation circuit 260 and the core circuit 270.

The internal clock generation circuit 210 may receive the clock CLK and generate an internal clock ICLK and an inverted internal clock ICLKB. The internal clock generation circuit 210 may generate the internal clock ICLK, which has the same phase as the clock CLK. The internal clock generation circuit 210 may generate the inverted internal clock ICLKB, which has a phase opposite to that of the clock CLK. The operation in which the internal clock generation circuit 210 may receive the clock CLK and generate the internal clock ICLK and the inverted internal clock ICLKB will be described later in detail with reference to FIG. 3.

The command decoder 220 may receive the command CMD and generate the first write command WTA and the second write command WTB for performing the write auto-precharge operation. The command decoder 220 may generate the first write command WTA and an auto-precharge signal APCG, which are enabled when the command CMD is input in synchronization with the rising edge of the internal clock ICLK. The command decoder 220 may generate the second write command WTB and the auto-precharge signal APCG, which are enabled when the command CMD is input in synchronization with the rising edge of the inverted internal clock ICLKB. While the command CMD is illustrated as one signal, the command CMD may be set to include a plurality of bits.

The address input circuit 230 may receive first to sixth addresses ADD<1:6> and may generate first and second bank group addresses BG<1:2>, first and second bank addresses BA<1:2>, and first and second column addresses COL<1:2>. The address input circuit 230 may generate the first and second bank group addresses BG<1:2> based on the first and second addresses ADD<1:2>. The address input circuit 230 may generate the first and second bank addresses BA<1:2> based on the third and fourth addresses ADD<3:4>. The address input circuit 230 may generate the first and second column addresses COL<1:2> based on the fifth and sixth addresses ADD<5:6>. The bits of the first to sixth addresses ADD<1:6> for generating the first and second bank group addresses BG<1:2>, the first and second bank addresses BA<1:2>, and the first and second column addresses COL<1:2> may be variously set depending on the embodiment. For example, the address input circuit 230 may be implemented to generate the first and second bank addresses BA<1:2> or the first and second column addresses COL<1:2> based on the first and second addresses ADD<1:2>.

The flag signal generation circuit 240 may generate the flag signal FLAG by detecting the generation times of the first write command WTA and the second write command WTB. The flag signal generation circuit 240 may generate the flag signal FLAG based on the first write command WTA and the second write command WTB. The flag signal generation circuit 240 may generate the flag signal FLAG, which is disabled when the first write command WTA is input. The flag signal generation circuit 240 may generate the flag signal FLAG, which is enabled when the second write command WTB is input.

The control circuit 250 may generate the first to fourth shifting rising clocks SCKR<1:4> and the first to third shifting falling clocks SCKF<1:3> by shifting the first write command WTA and the second write command WTB in synchronization with the internal clock ICLK. The control circuit 250 may generate an internal write command IWT and a write auto-precharge signal WPCG for performing the write auto-precharge operation based on the first write command WTA, the second write command WTB, and the auto-precharge signal APCG.

The internal address generation circuit 260 may serialize the flag signal FLAG, the first and second bank group addresses BG<1:2>, the first and second bank addresses BA<1:2>, and the first and second column addresses COL<1:2> in synchronization with the first to fourth shifting rising clocks SCKR<1:4> and the first to third shifting falling clocks SCKF<1:3>. The internal address generation circuit 260 may parallelize the flag signal FLAG, the first and second bank group addresses BG<1:2>, the first and second bank addresses BA<1:2>, and the first and second column addresses COL<1:2>, which are serialized, in synchronization with the internal clock ICLK and the inverted internal clock ICLKB, and thereby, may generate the first and second internal bank group addresses IBG<1:2>, the first and second internal bank addresses IBA<1:2>, and the first and second internal column addresses ICOL<1:2>.

The core circuit 270 may include a first bank group BG1, a second bank group BG2, a third bank group BG3, and a fourth bank group BG4. The first bank group BG1, the second bank group BG2, the third bank group BG3 and the fourth bank group BG4 may be selectively activated based on a logic level combination of the first and second internal bank group addresses IBG<1:2>. For example, when the first internal bank group address IBG<1> is a logic low level and the second internal bank group address IBG<2> is a logic low level, the first bank group BG1 may be activated.

When the internal write command IWT and the write auto-precharge signal WPCG are input and the first bank group BG1 is activated by the first and second internal bank group addresses IBG<1:2>, the first bank group BG1 may perform a precharge operation after performing a write operation of storing data DATA in a memory cell (not illustrated) that is selected by the first and second internal bank addresses IBA<1:2> and the first and second internal column addresses ICOL<1:2>.

When the internal write command IWT and the write auto-precharge signal WPCG are input and the second bank group BG2 is activated by the first and second internal bank group addresses IBG<1:2>, the second bank group BG2 may perform a precharge operation after performing a write operation that stores data DATA in a memory cell (not illustrated) that is selected by the first and second internal bank addresses IBA<1:2> and the first and second internal column addresses ICOL<1:2>.

When the internal write command IWT and the write auto-precharge signal WPCG are input and the third bank group BG3 is activated by the first and second internal bank group addresses IBG<1:2>, the third bank group BG3 may perform a precharge operation after performing a write operation of storing data DATA in a memory cell (not illustrated) that is selected by the first and second internal bank addresses IBA<1:2> and the first and second internal column addresses ICOL<1:2>.

When the internal write command IWT and the write auto-precharge signal WPCG are input and the fourth bank group BG4 is activated by the first and second internal bank group addresses IBG<1:2>, the fourth bank group BG4 may perform a precharge operation after performing a write operation of storing data DATA in a memory cell (not illustrated) selected by the first and second internal bank addresses IBA<1:2> and the first and second internal column addresses ICOL<1:2.

Figure 3:
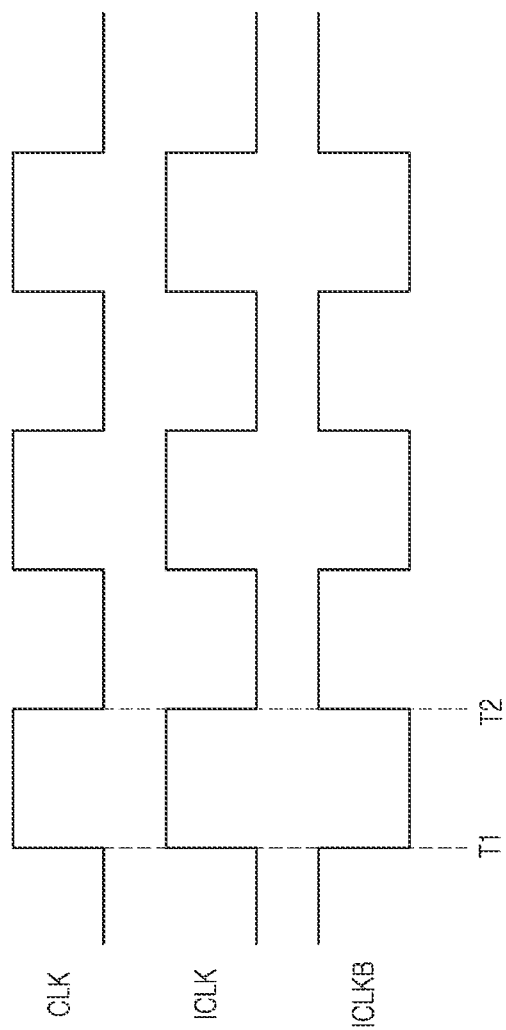
FIG. 3 is a diagram to assist in the explanation of the operation of an internal clock generation circuit included in the semiconductor device illustrated in FIG. 2.

FIG. 3 is a diagram to assist in the explanation of the operation of the internal clock generation circuit 210.

At time T1, the internal clock generation circuit 210 may generate the internal clock ICLK, which includes a pulse that is generated in synchronization with the rising edge of the clock CLK. The internal clock generation circuit 210 may generate the internal clock ICLK, which has the same phase as the clock CLK.

At time T2, the internal clock generation circuit 210 may generate the inverted internal clock ICLKB, which includes a pulse that is generated in synchronization with the falling edge of the clock CLK. The internal clock generation circuit 210 may generate the inverted internal clock ICLKB, which has a phase opposite to that of the clock CLK.

That is to say, the internal clock generation circuit 210 may generate the internal clock ICLK, which has the same phase as the clock CLK, and may generate the inverted internal clock ICLKB, which has a phase opposite to that of the clock CLK.

Figure 4:
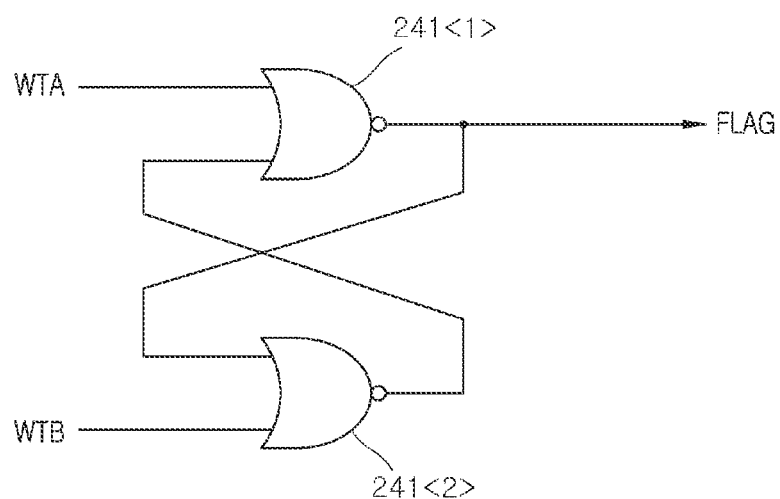
FIG. 4 is a circuit diagram illustrating a configuration of a flag signal generation circuit included in the semiconductor device illustrated in FIG. 2.

FIG. 4 is a circuit diagram illustrating a configuration of the flag signal generation circuit 240 in accordance with the embodiment of the disclosure. As illustrated in FIG. 4, the flag signal generation circuit 240 may be implemented with NOR gates 241<1> and 241<2>.

The NOR gate 241<1> may output an output signal by performing a NOR operation on the first write command WTA and an output signal of the NOR gate 241<2>. The NOR gate 241<2> may output the output signal by performing a NOR operation on the second write command WTB and the output signal of the NOR gate 241<1>.

The flag signal generation circuit 240 may generate the flag signal FLAG, which is disabled to a logic low level, when the first write command WTA is input at a logic high level. The flag signal generation circuit 240 may generate the flag signal FLAG, which is enabled to a logic high level, when the second write command WTB is input at a logic high level.

Figure 5:
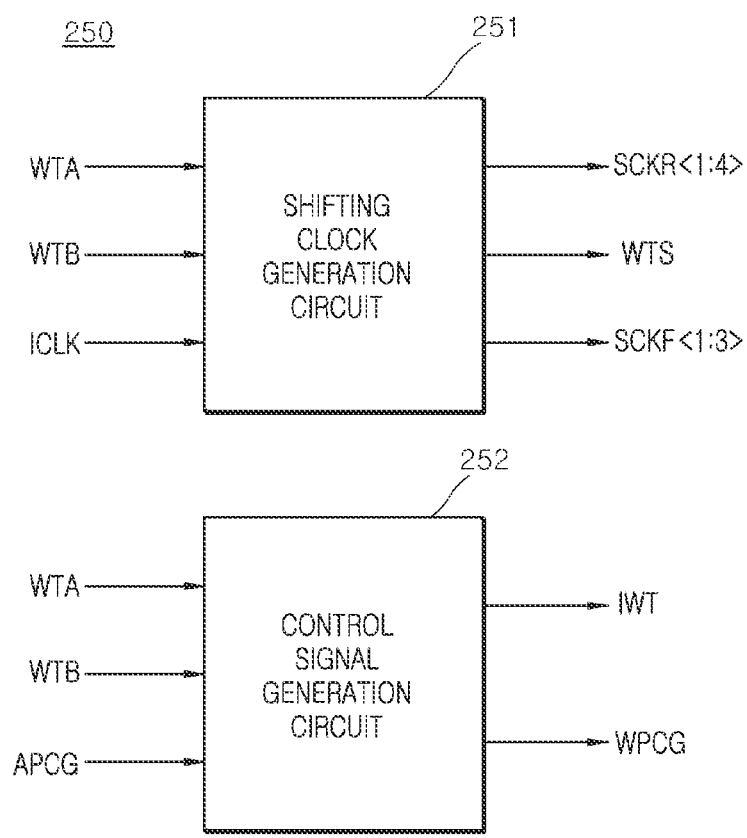
FIG. 5 is a block diagram illustrating a configuration of a control circuit included in the semiconductor device illustrated in FIG. 2.

FIG. 5 is a block diagram illustrating a configuration of the control circuit 250 in accordance with the embodiment of the disclosure. As illustrated in FIG. 5, the control circuit 250 may include a shifting clock generation circuit 251 and a control signal generation circuit 252.

The shifting clock generation circuit 251 may generate the first to fourth shifting rising clocks SCKR<1:4> and the first to third shifting falling clocks SCKF<1:3> by shifting the first write command WTA and the second write command WTB in synchronization with the internal clock ICLK. The shifting clock generation circuit 251 may generate a write shifting signal WTS by shifting the fourth shifting rising clock SCKR<4> in synchronization with the internal clock ICLK.

The control signal generation circuit 252 may generate the internal write command IWT for performing the write auto-precharge operation by synthesizing the first write command WTA and the second write command WTB. When the auto-precharge signal APCG is enabled and any one of the first write command WTA and the second write command WTB is input, the control signal generation circuit 252 may generate the write auto-precharge signal WPCG for performing the write auto-precharge operation.

Figure 6:
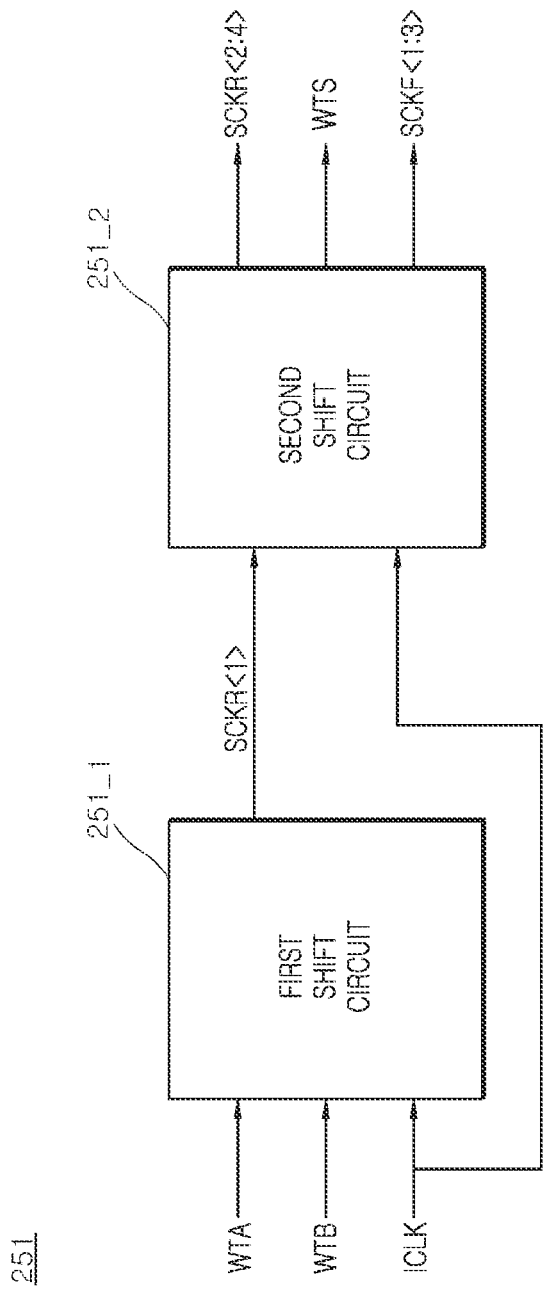
FIG. 6 is a block diagram illustrating a configuration of a shifting clock generation circuit included in the control circuit illustrated in FIG. 5.

FIG. 6 is a block diagram illustrating a configuration of the shifting clock generation circuit 251 in accordance with the embodiment of the disclosure. As illustrated in FIG. 6, the shifting clock generation circuit 251 may include a first shift circuit 251_1 and a second shift circuit 251_2.

The first shift circuit 251_1 may generate the first shifting rising clock SCKR<1> based on the first write command WTA in synchronization with the internal clock ICLK. The first shift circuit 2511 may generate the first shifting rising clock SCKR<1> based on the second write command WTB in synchronization with the internal clock ICLK.

The second shift circuit 2512 may generate the second to fourth shifting rising clocks SCKR<2:4>, which are sequentially generated, by shifting the first shifting rising clock SCKR<1> in synchronization with the internal clock ICLK. The second shift circuit 2512 may generate the first to third shifting falling clocks SCKF<1:3>, which are sequentially generated, by shifting the first shifting rising clock SCKR<1> in synchronization with the internal clock ICLK. The second shift circuit 251_2 may generate the write shifting signal WTS by shifting the fourth shifting rising clock SCKR<4> in synchronization with the internal clock ICLK.

Figure 7:
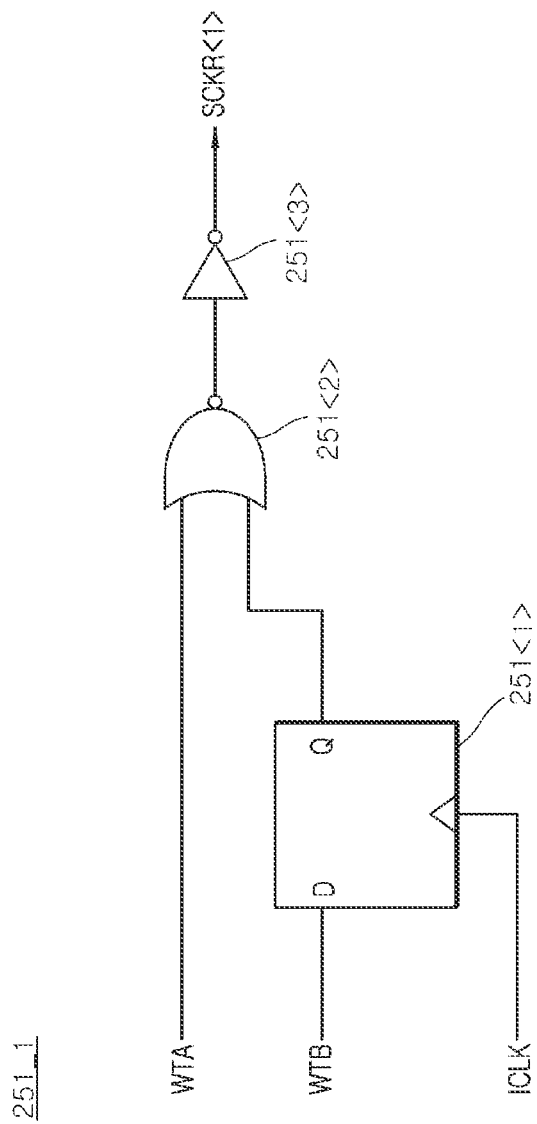
FIG. 7 is a diagram illustrating a configuration of a first shift circuit included in the shifting clock generation circuit illustrated in FIG. 6.

FIG. 7 is a block diagram illustrating a configuration of the first shift circuit 251_1 in accordance with the embodiment of the disclosure. As illustrated in FIG. 7, the first shift circuit 251_1 may be implemented with a flip-flop 251<1>, a NOR gate 251<2>, and an inverter 251<3>.

The flip-flop 251<1> may latch the second write command WTB in synchronization with the rising edge of the internal clock ICLK and may output the latched second write command WTB.

The NOR gate 251<2> may output an output signal by performing a NOR operation on the first write command WTA and an output signal of the flip-flop 251<1>.

The inverter 251<3> may generate the first shifting rising clock SCKR<1> by inverting and buffering the output signal of the NOR gate 251<2>.

The first shift circuit 251_1 may generate the first shifting rising clock SCKR<1> with a logic high level when the first write command WTA is input at a logic high level. The first shift circuit 2511 may generate the first shifting rising clock SCKR<1> with a logic high level in synchronization with the internal clock ICLK when the second write command WTB is input at a logic high level. The first shift circuit 251_1 may generate the first shifting rising clock SCKR<1> with a logic high level when any one of the first write command WTA and the second write command WTB is input at a logic high level in synchronization with the internal clock ICLK.

Figure 8:
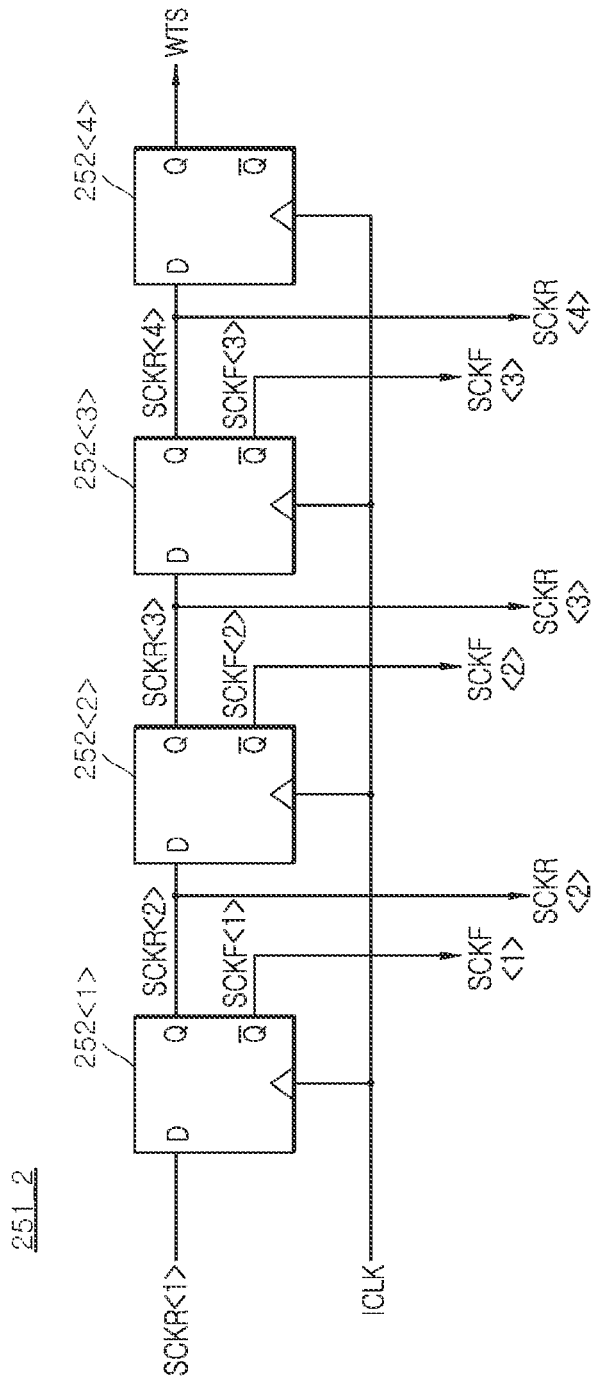
FIG. 8 is a diagram illustrating a configuration of a second shift circuit included in the shifting clock generation circuit illustrated in FIG. 6.

FIG. 8 is a block diagram illustrating a configuration of the second shift circuit 251_2 in accordance with the embodiment of the disclosure. As illustrated in FIG. 8, the second shift circuit 251_2 may be implemented with a plurality of flip-flops 252<1>, 252<2>, 252<3>, and 252<4>.

The flip-flop 252<1> may generate the first shifting falling clock SCKF<1> by shifting the first shifting rising clock SCKR<1> by half the cycle of the internal clock ICLK. The flip-flop 252<1> may generate the second shifting rising clock SCKR<2> by shifting the first shifting falling clock SCKF<1> by half the cycle of the internal clock ICLK.

The flip-flop 252<2> may generate the second shifting falling clock SCKF<2> by shifting the second shifting rising clock SCKR<2> by half the cycle of the internal clock ICLK. The flip-flop 252<2> may generate the third shifting rising clock SCKR<3> by shifting the second shifting falling clock SCKF<2> by half the cycle of the internal clock ICLK.

The flip-flop 252<3> may generate the third shifting falling clock SCKF<3> by shifting the third shifting rising clock SCKR<3> by half the cycle of the internal clock ICLK. The flip-flop 252<3> may generate the fourth shifting rising clock SCKR<4> by shifting the third shifting falling clock SCKF<3> by half the cycle of the internal clock ICLK.

The flip-flop 252<4> may generate the write shifting signal WTS by shifting the fourth shifting rising clock SCKR<4> by half the cycle of the internal clock ICLK.

The second shift circuit 251_2 may generate the second to fourth shifting rising clocks SCKR<2:4>, which are sequentially generated, by shifting the first shifting rising clock SCKR<1> in synchronization with the internal clock ICLK. The second shift circuit 251_2 may generate the first to third shifting falling clocks SCKF<1:3>, which are sequentially generated, by shifting the first shifting rising clock SCKR<1> in synchronization with the internal clock ICLK. The second shift circuit 251_2 may generate the write shifting signal WTS by shifting the fourth shifting rising clock SCKR<4> in synchronization with the internal clock ICLK.

Figure 9:
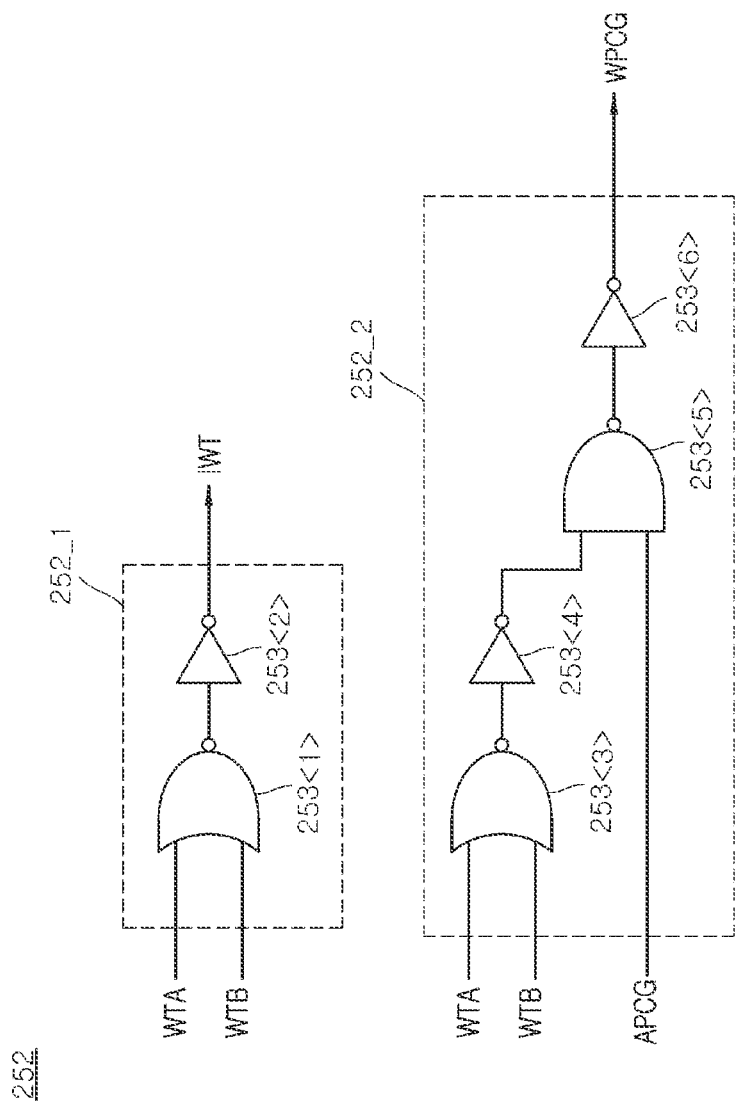
FIG. 9 is a circuit diagram illustrating a configuration of a control signal generation circuit included in the control circuit illustrated in FIG. 5.

FIG. 9 is a block diagram illustrating a configuration of the control signal generation circuit 252 in accordance with the embodiment of the disclosure. As illustrated in FIG. 9, the control signal generation circuit 252 may include a first logic circuit 252_1 and a second logic circuit 252_2.

The first logic circuit 252_1 may be implemented with a NOR gate 253<1> and an inverter 253<2>. The first logic circuit 2521 may generate the internal write command IWT by performing an OR operation on the first write command WTA and the second write command WTB. The first logic circuit 252_1 may generate the internal write command IWT, which is enabled to a logic high level, when any one of the first write command WTA and the second write command WTB is input at a logic high level. The first logic circuit 2521 may generate the internal write command IWT for performing the write auto-precharge operation by synthesizing the first write command WTA and the second write command WTB.

The second logic circuit 2522 may be implemented with a NOR gate 253<3>, an inverter 253<4>, a NAND gate 253<5>, and an inverter 253<6>. The second logic circuit 252_2 may generate the write auto-precharge signal WPCG which is enabled to a logic high level, when the auto-precharge signal APCG is enabled to a logic high level and any one of the first write command WTA and the second write command WTB is input at a logic high level. The second logic circuit 252_2 may generate the write auto-precharge signal WPCG for performing the write auto-precharge operation based on the first write command WTA and the second write command WTB when the auto-precharge signal APCG is enabled.

Figure 10:
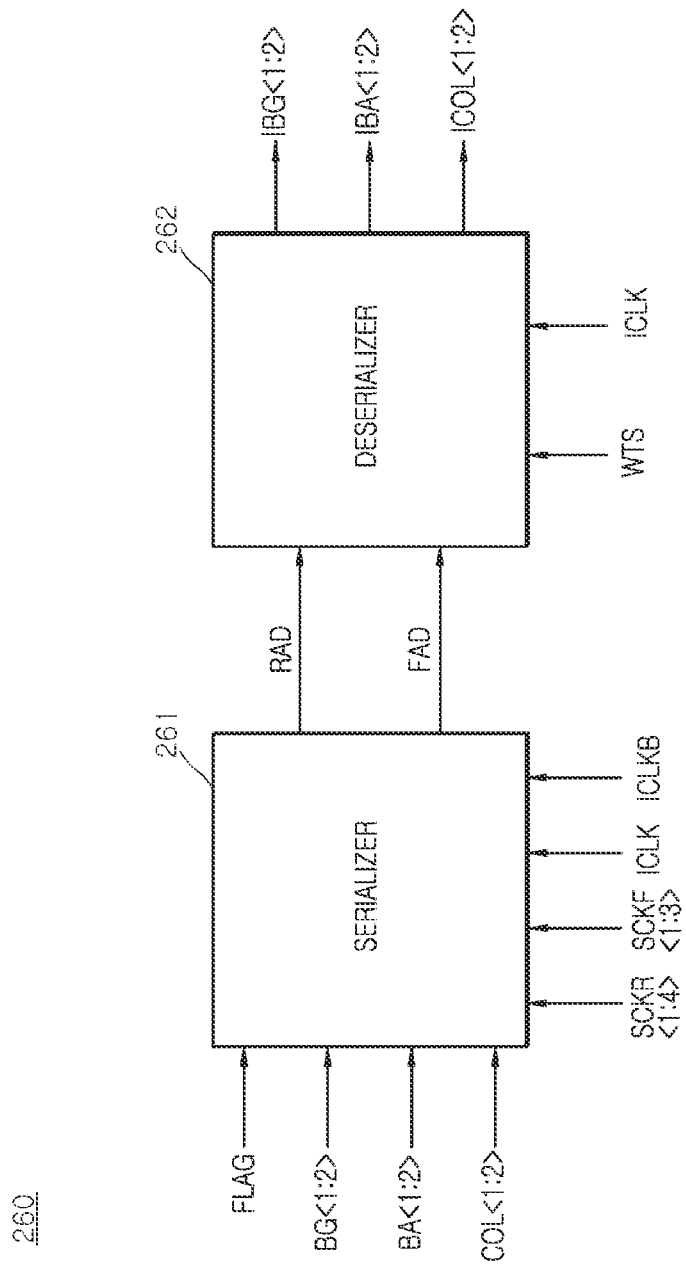
FIG. 10 is a block diagram illustrating a configuration of an internal address generation circuit included in the semiconductor device illustrated in FIG. 2.

FIG. 10 is a block diagram illustrating a configuration of the internal address generation circuit 260 in accordance with the embodiment of the disclosure. As illustrated in FIG. 10, the internal address generation circuit 260 may include a serializer 261 and a deserializer 262.

The serializer 261 may serialize the flag signal FLAG, the first and second bank group addresses BG<1:2>, the first and second bank addresses BA<1:2>, and the first and second column addresses COL<1:2> based on the first to fourth shifting rising clocks SCKR<1:4> and the first to third shifting falling clocks SCKF<1:3> in synchronization with the internal clock ICLK and the inverted internal clock ICLKB. The serializer 261 may generate a rising address RAD and a falling address FAD by shifting the flag signal FLAG, the first and second bank group addresses BG<1:2>, the first and second bank addresses BA<1:2>, and the first and second column addresses COL<1:2>, which are serialized, in synchronization with the internal clock ICLK and the inverted internal clock ICLKB.

The deserializer 262 may generate the first and second internal bank group addresses IBG<1:2>, the first and second internal bank addresses IBA<1:2>, and the first and second internal column addresses ICOL<1:2> by parallelizing the rising address RAD and the falling address FAD based on the write shifting signal WTS in synchronization with the internal clock ICLK.

Figure 11:
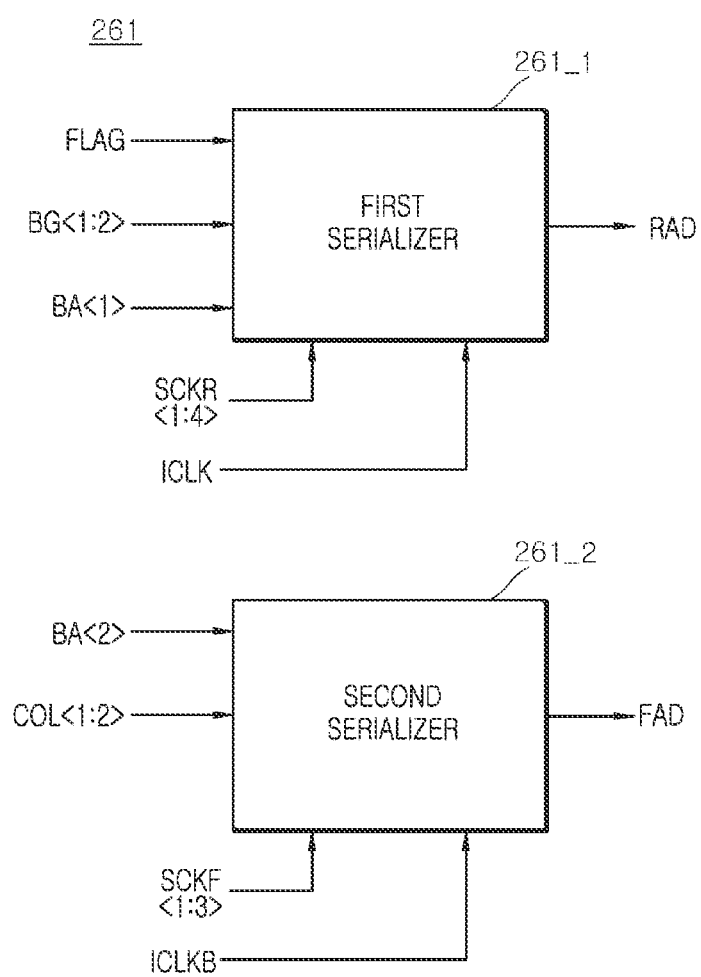
FIG. 11 is a block diagram illustrating a configuration of a serializer included in the internal address generation circuit illustrated in FIG. 10.

FIG. 11 is a block diagram illustrating a configuration of the serializer 261 in accordance with the embodiment of the disclosure. As illustrated in FIG. 11, the serializer 261 may include a first serializer 261_1 and a second serializer 261_2.

The first serializer 261_1 may generate the rising address RAD by serializing the first and second bank group addresses BG<1:2>, the flag signal FLAG, and the first bank address BA<1> by the first to fourth shifting rising clocks SCKR<1:4> in synchronization with the internal clock ICLK.

The second serializer 261_2 may generate the falling address FAD by serializing the second bank address BA<2> and the first and second column addresses COL<1:2> based on the first to third shifting falling clocks SCKF<1:3> in synchronization with the inverted internal clock ICLKB.

Figure 12:
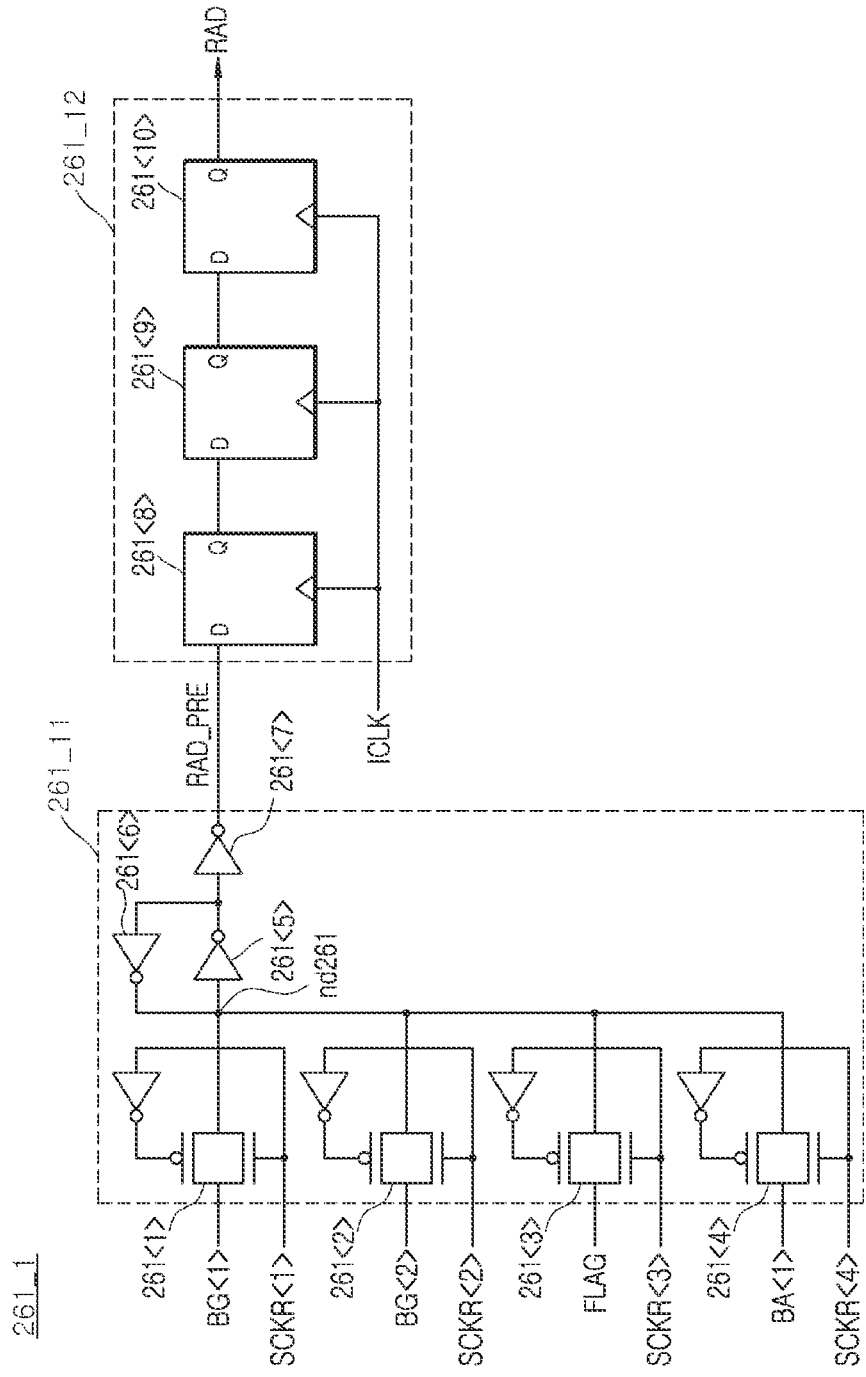
FIG. 12 is a diagram illustrating a configuration of a first serializer included in the serializer illustrated in FIG. 11.

FIG. 12 is a diagram illustrating a configuration of the first serializer 261_1 in accordance with the embodiment of the disclosure. As illustrated in FIG. 12, the first serializer 261_1 may include a pre-rising address generation circuit 261_11 and a rising address generation circuit 261_12.

The pre-rising address generation circuit 261_11 may be implemented with transfer gates 261<1>, 261<2>, 261<3>, and 261<4> and inverters 261<5>, 261<6>, and 261<7>.

The transfer gate 261<1> may output the first bank group address BG<1> to a node nd261 during a period in which the first shifting rising clock SCKR<1> is a logic high level. The transfer gate 261<2> may output the second bank group address BG<2> to the node nd261 during a period in which the second shifting rising clock SCKR<2> is a logic high level. The transfer gate 261<3> may output the flag signal FLAG to the node nd261 during a period in which the third shifting rising clock SCKR<3> is a logic high level. The transfer gate 261<4> may output the first bank address BA<1> to the node nd261 during a period in which the fourth shifting rising clock SCKR<4> is a logic high level. The inverters 261<5>, 261<6>, and 261<7> may latch a signal of the node nd261, may buffer the latched signal of the node nd261, and may generate a pre-rising address RAD_PRE.

The pre-rising address generation circuit 261_11 may generate the pre-rising address RAD_PRE by serializing the first and second bank group addresses BG<1:2>, the flag signal FLAG, and the first bank address BA<1> based on the first to fourth shifting rising clocks SCKR<1:4>.

The rising address generation circuit 261_12 may be implemented with flip-flops 261<8>, 261<9>, and 261<10>.

The flip-flop 261<8> may shift the pre-rising address RAD_PRE by one cycle of the internal clock ICLK and output an output signal. The flip-flop 261<9> may shift the output signal of the flip-flop 261<8> by one cycle of the internal clock ICLK and may output an output signal. The flip-flop 261<10> may shift the output signal of the flip-flop 261<9> by one cycle of the internal clock ICLK and may generate the rising address RAD.

The rising address generation circuit 261_12 may generate the rising address RAD by shifting the pre-rising address RAD_PRE in synchronization with the internal clock ICLK. Although the rising address generation circuit 261_12 is implemented with three flip-flops 261<8>, 261<9>, and 261<10>, the rising address generation circuit 261_12 may be implemented with a various number of flip-flops depending on the embodiment so as to adjust a shifting amount.

Figure 13:
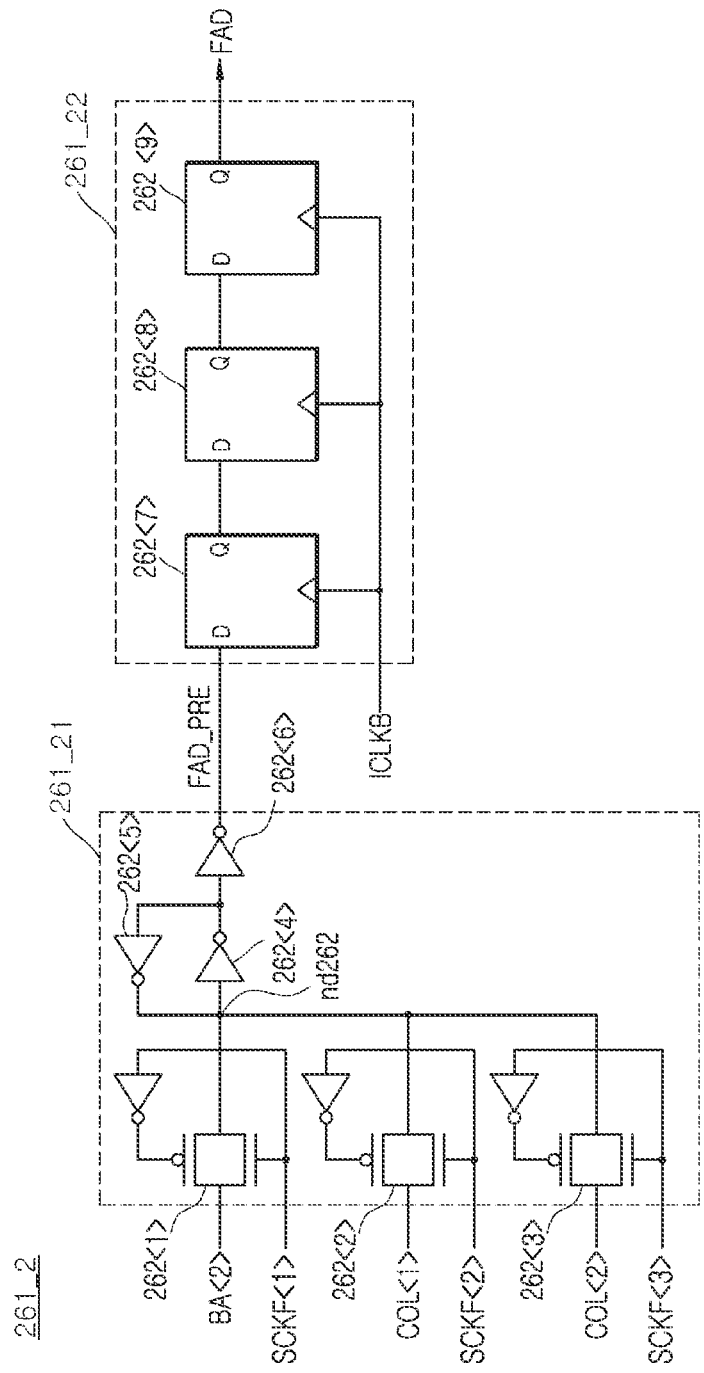
FIG. 13 is a diagram illustrating a configuration of a second serializer included in the serializer illustrated in FIG. 11.

FIG. 13 is a diagram illustrating a configuration of the second serializer 261_2 in accordance with the embodiment of the disclosure. As illustrated in FIG. 13, the second serializer 261_2 may include a pre-falling address generation circuit 261_21 and a falling address generation circuit 261_22.

The pre-falling address generation circuit 261_21 may be implemented with transfer gates 262<1>, 262<2>, and 262<3> and inverters 262<4>, 262<5>, and 262<6>.

The transfer gate 262<1> may output the second bank address BA<2> to a node nd262 during a period in which the first shifting falling clock SCKF<1> is a logic high level. The transfer gate 262<2> may output the first column address COL<1> to the node nd262 during a period in which the second shifting falling clock SCKF<2> is a logic high level. The transfer gate 262<3> may output the second column address COL<2> to the node nd262 during a period in which the third shifting falling clock SCKF<3> is a logic high level. The inverters 262<4>, 262<5>, and 262<6> may latch a signal of the node nd262, may buffer the latched signal of the node nd262, and may generate a pre-falling address FAD_PRE.

The pre-falling address generation session 261_21 may generate the pre-falling address FAD_PRE by serializing the second bank address BA<2> and the first and second column addresses COL<1:2> based on the first to third shifting falling clocks SCKF<1:3>.

The falling address generation circuit 261_22 may be implemented with flip-flops 262<7>, 262<8>, and 262<9>.

The flip-flop 262<7> may shift the pre-falling address FAD_PRE by one cycle of the inverted internal clock ICLKB and output an output signal. The flip-flop 262<8> may shift the output signal of the flip-flop 262<7> by one cycle of the inverted internal clock ICLKB and output an output signal. The flip-flop 262<9> may shift the output signal of the flip-flop 262<8> by one cycle of the inverted internal clock ICLKB and generate the falling address FAD.

The falling address generation circuit 261_22 may generate the falling address FAD by shifting the pre-falling address FAD_PRE in synchronization with the inverted internal clock ICLKB. Although the falling address generation circuit 261_22 is implemented with three flip-flops 262<7>, 262<8>, and 262<9>, the falling address generation circuit 262_22 may be implemented with a various number of flip-flops depending on the embodiment so as to adjust the amount of shifting.

Figure 14:
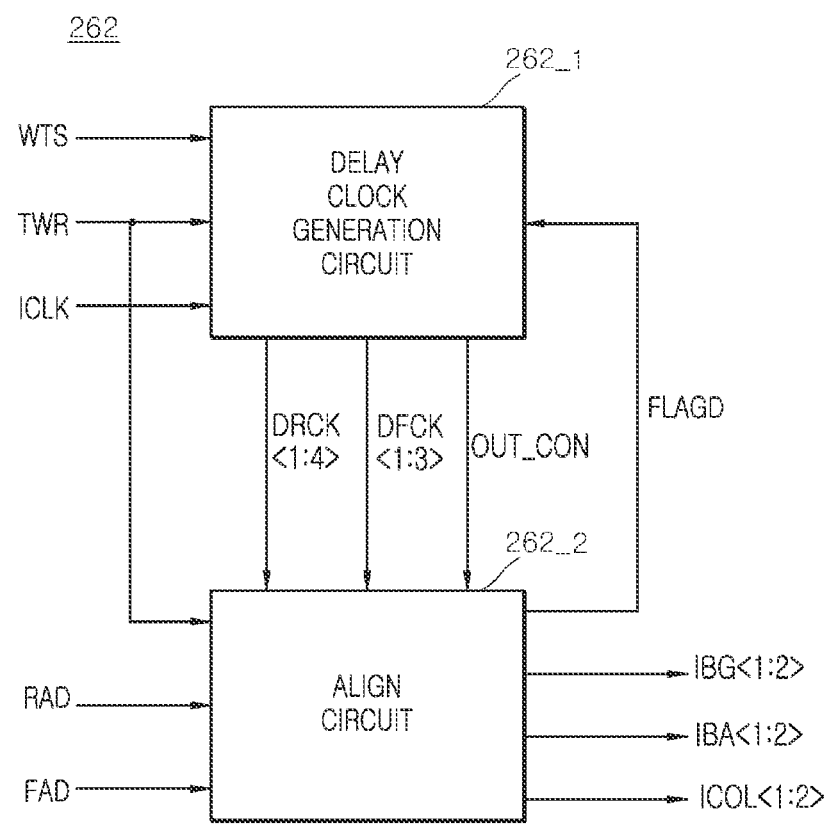
FIG. 14 is a block diagram illustrating a configuration of a deserializer included in the internal address generation circuit illustrated in FIG. 10.

FIG. 14 is a block diagram illustrating a configuration of the deserializer 262 in accordance with the embodiment of the disclosure. As illustrated in FIG. 14, the deserializer 262 may include a delay clock generation circuit 262_1 and an alignment circuit 262_2.

When a mode setting signal TWR is enabled, the delay clock generation circuit 262_1 may generate first to fourth rising delay clocks DRCK<1:4> and first to third falling delay clocks DFCK<1:3> by shifting the write shifting signal WTS in synchronization with the internal clock ICLK. The delay clock generation circuit 262_1 may output any one of the fourth rising delay clock DRCK<4> and the third falling delay clock DFCK<3> as an output control signal OUT_CON based on a delay flag signal FLAGD. The mode setting signal TWR may be set as a signal that is enabled in the write auto-precharge operation. The mode setting signal TWR may be set as a signal, which is generated in a mode register set (MRS), provided in the semiconductor device 120.

When the mode setting signal TWR is enabled, the alignment circuit 2622 may parallelize the rising address RAD and the falling address FAD in synchronization with the first to fourth rising delay clocks DRCK<1:4> and the first to third falling delay clocks DFCK<1:3>. The alignment circuit 262_2 may generate the first and second internal bank group addresses IBG<1:2>, the first and second internal bank addresses IBA<1:2>, and the first and second internal column addresses ICOL<1:2>, based on the rising address RAD and the falling address FAD, which are parallelized, and based on the output control signal OUT_CON.

Figure 15:
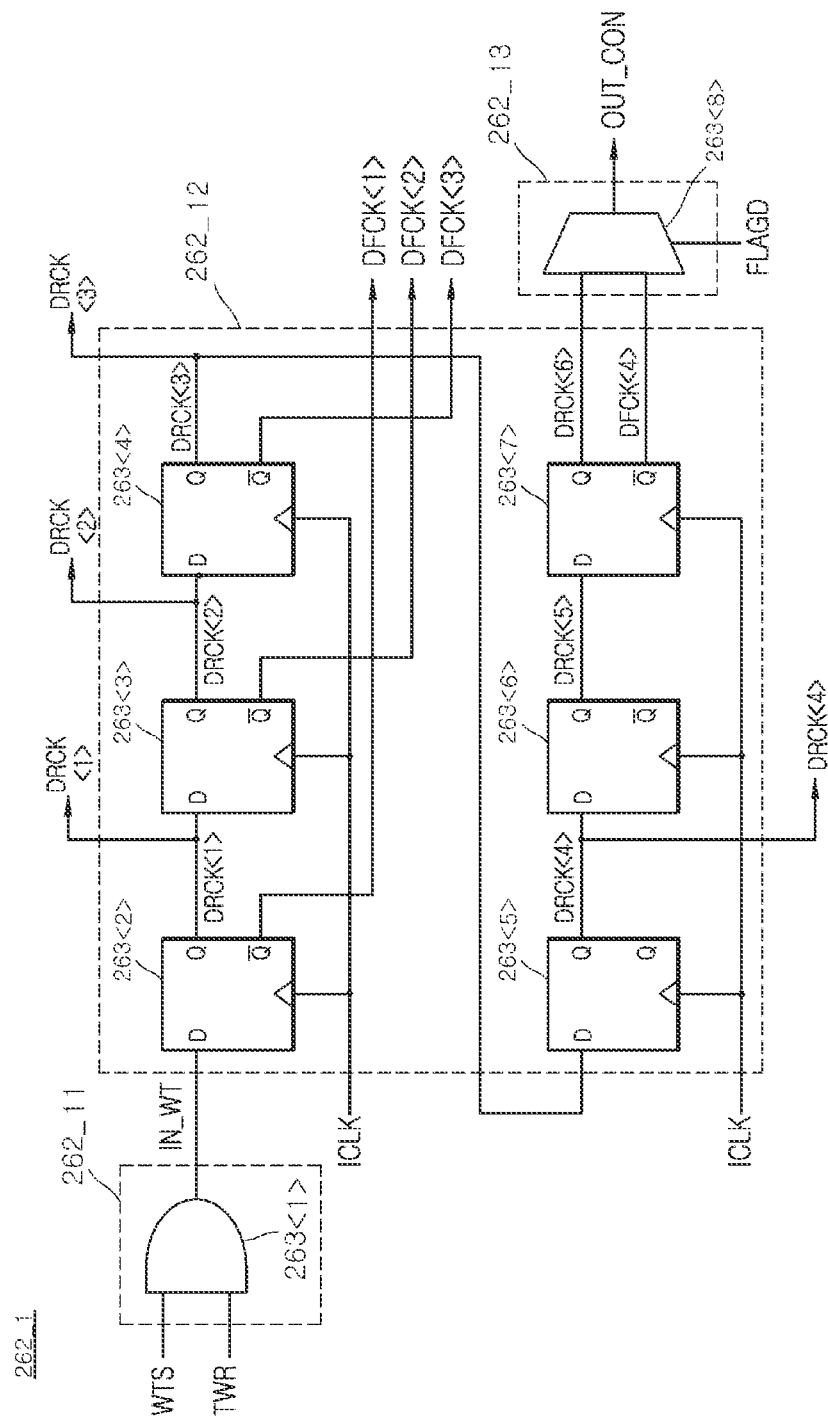
FIG. 15 is a diagram illustrating a configuration of a delay clock generation circuit included in the deserializer illustrated in FIG. 14.

FIG. 15 is a diagram illustrating a configuration of the delay clock generation circuit 262_1 in accordance with the embodiment of the disclosure. As illustrated in FIG. 15, the delay clock generation circuit 262_1 may include an input write signal generation circuit 262_11, an internal shifting circuit 262_12, and a selective output circuit 262_13.

The input write signal generation circuit 262_11 may be implemented with an AND gate 263<1>. The input write signal generation circuit 262_11 may generate an input write signal IN_WT by buffering the write shifting signal WTS when the mode setting signal TWR is enabled to a logic high level. The input write signal generation circuit 262_11 may block the input of the write shifting signal WTS when the mode setting signal TWR is disabled to a logic low level.

The internal shifting circuit 262_12 may be implemented with a plurality of flip-flops 263<2>, 263<3>, 263<4>, 263<5>, 263<6>, and 263<7>.

The flip-flop 263<2> may output the write shifting signal WTS as the first rising delay clock DRCK<1> in synchronization with the internal clock ICLK. The flip-flop 263<2> may generate the first falling delay clock DFCK<1> by shifting the first rising delay clock DRCK<1> by half the cycle of the internal clock ICLK.

The flip-flop 263<3> may generate the second rising delay clock DRCK<2> by shifting the first rising delay clock DRCK<1> by one cycle of the internal clock ICLK. The flip-flop 263<3> may generate the second falling delay clock DFCK<2> by shifting the second rising delay clock DRCK<2> by half the cycle of the internal clock ICLK.

The flip-flop 263<4> may generate the third rising delay clock DRCK<3> by shifting the second rising delay clock DRCK<2> by one cycle of the internal clock ICLK. The flip-flop 263<4> may generate the third falling delay clock DFCK<3> by shifting the third rising delay clock DRCK<3> by half the cycle of the internal clock ICLK.

The flip-flop 263<5> may generate the fourth rising delay clock DRCK<4> by shifting the third rising delay clock DRCK<3> by one cycle of the internal clock ICLK.

The flip-flop 263<6> may generate a fifth rising delay clock DRCK<5> by shifting the fourth rising delay clock DRCK<4> by one cycle of the internal clock ICLK.

The flip-flop 263<7> may generate a fourth falling delay clock DFCK<4> by shifting the fifth rising delay clock DRCK<5> by half the cycle of the internal clock ICLK. The flip-flop 263<7> may generate a sixth rising delay clock DRCK<6> by shifting the fifth rising delay clock DRCK<5> by one cycle of the internal clock ICLK.

The selective output circuit 262_13 may be implemented with a multiplexer 263<8>.

When the delay flag signal FLAGD is disabled, the multiplexer 263<8> may output the sixth rising delay clock DRCK<6> as the output control signal OUT_CON. When the delay flag signal FLAGD is enabled, the multiplexer 263<8> may output the fourth falling delay clock DFCK<4> as the output control signal OUT_CON.

Figure 16:
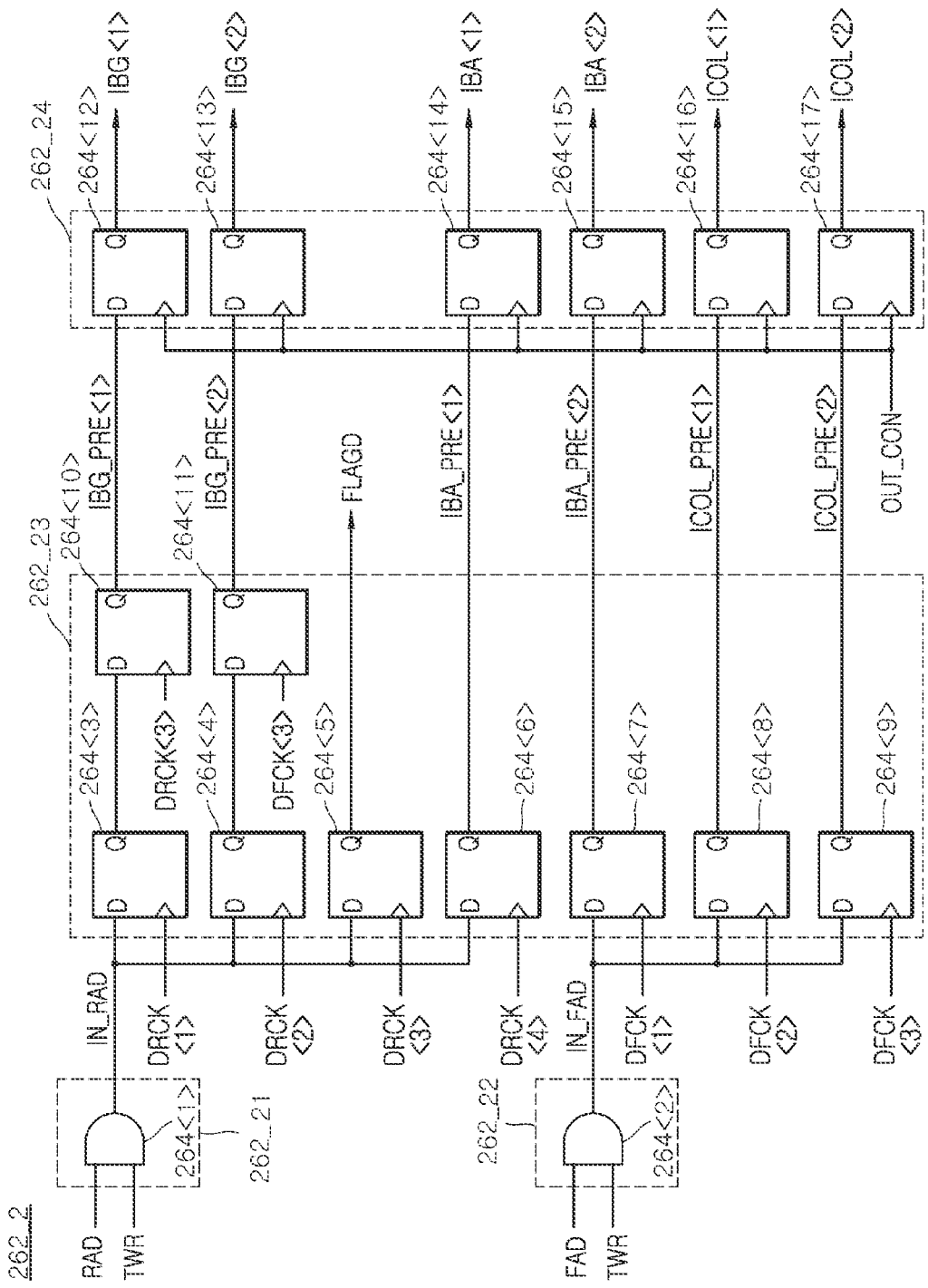
FIG. 16 is a diagram illustrating a configuration of an alignment circuit included in the deserializer illustrated in FIG. 14.

FIG. 16 is a diagram illustrating a configuration of the alignment circuit 262_2 in accordance with the embodiment of the disclosure. As illustrated in FIG. 16, the alignment circuit 262_2 may include a rising address input circuit 26221, a falling address input circuit 262_22, a pre-internal address generation circuit 262_23, and an address output circuit 262_24.

The rising address input circuit 262_21 may be implemented with an AND gate 264<1>. The rising address input circuit 262_21 may generate an input rising address IN_RAD by buffering the rising address RAD when the mode setting signal TWR is enabled to a logic high level. The rising address input circuit 26221 may block the input of the rising address RAD when the mode setting signal TWR is disabled to a logic low level.

The falling address input circuit 262_22 may be implemented with an AND gate 264<2>. The falling address input circuit 262_22 may generate an input falling address IN_FAD by buffering the falling address FAD when the mode setting signal TWR is enabled to a logic high level. The falling address input circuit 262_22 may block the input of the falling address FAD when the mode setting signal TWR is disabled to a logic low level.

The pre-internal address generation circuit 262_23 may be implemented with a plurality of flip-flops 264<3>, 264<4>, 264<5>, 264<6>, 264<7>, 264<8>, 264<9>, 264<10>, and 264<11>.

The flip-flop 264<3> may receive and output the input rising address IN_RAD during a period in which the first delay rising clock DRCK<1> is a logic high level. The flip-flop 264<4> may receive and output the input rising address IN_RAD during a period in which the second delay rising clock DRCK<2> is a logic high level. The flip-flop 264<5> may generate the delay flag signal FLAGD by receiving the input rising address IN_RAD during a period in which the third delay rising clock DRCK<3> is a logic high level. The flip-flop 264<6> may generate a first pre-internal bank address IBA_PRE<1> by receiving the input rising IN_RAD during a period in which the fourth delay rising clock DRCK<4> is a logic high level. The flip-flop 264<7> may generate a second pre-internal bank address IBA_PRE<2> by receiving the input falling address IN_FAD during a period in which the first delay falling clock DFCK<1> is a logic high level. The flip-flop 264<8> may generate a first pre-internal column address ICOL_PRE<1> by receiving the input falling address IN_FAD during a period in which the second delay falling clock DFCK<2> is a logic high level. The flip-flop 264<9> may generate a second pre-internal column address ICOL_PRE<2> by receiving the input falling address IN_FAD during a period in which the third delay falling clock DFCK<3> is a logic high level. The flip-flop 264<10> may generate a first pre-internal bank group address IBG_PRE<1> by receiving an output signal of the flip-flop 264<3> during a period in which the third delay rising clock DRCK<3> is a logic high level. The flip-flop 264<11> may generate a second pre-internal bank group address IBG_PRE<2> by receiving an output signal of the flip-flop 264<4> during a period in which the third delay falling clock DFCK<3> is a logic high level.

The address output circuit 262_24 may be implemented with a plurality of flip-flops 264<12>, 264<13>, 264<14>, 264<15>, 264<16>, and 264<17>.

The flip-flop 264<12> may generate the first internal bank group address IBG<1> by receiving the first pre-internal bank group address IBG_PRE<1> during a period in which the output control signal OUT_CON is a logic high level. The flip-flop 264<13> may generate the second internal bank group address IBG<2> by receiving the second pre-internal bank group address IBG_PRE<2> during a period in which the output control signal OUT_CON is a logic high level. The flip-flop 264<14> may generate the first internal bank address IBA<1> by receiving the first pre-internal bank address IBA_PRE<1> during a period in which the output control signal OUT_CON is a logic high level. The flip-flop 264<15> may generate the second internal bank address IBA<2> by receiving the second pre-internal bank address IBA_PRE<2> during a period in which the output control signal OUT_CON is a logic high level. The flip-flop 264<16> may generate the first internal column address ICOL<1> by receiving the first pre-internal column address ICOL_PRE<1> during a period in which the output control signal OUT_CON is a logic high level. The flip-flop 264<17> may generate the second internal column address ICOL<2> by receiving the second pre-internal column address ICOL_PRE<2> during a period in which the output control signal OUT_CON is a logic high level.

Figure 17:
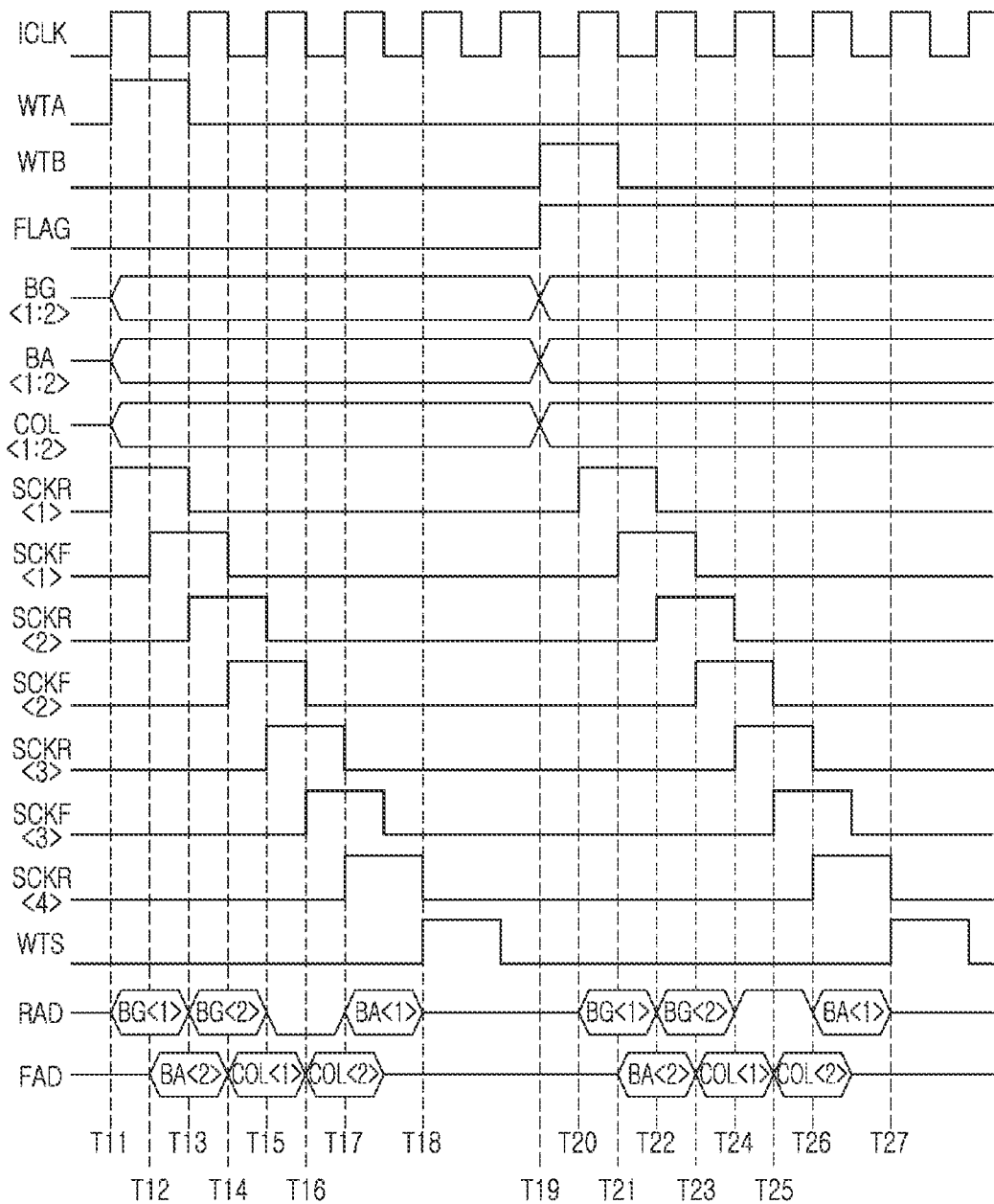
FIGS. 17 to 19 are timing diagrams to assist in the explanation of the operation of the semiconductor system in accordance with the embodiment of the disclosure.

With reference to FIG. 17, the operation of serializing addresses that are input in parallel during the write auto-precharge operation of the semiconductor system 100 in accordance with the embodiment of the disclosure will be described below.

First, a case in which the controller 110 outputs the command CMD and the address ADD for performing the write auto-precharge operation, in synchronization with the rising edge of the clock CLK, will be described below as an example.

At time T11, the command decoder 220 may receive the command CMD and may generate the first write command WTA for performing the write auto-precharge operation.

The address input circuit 230 may receive the first to sixth addresses ADD<1:6> and may generate the first and second bank group addresses BG<1:2>, the first and second bank addresses BA<1:2>, and the first and second column addresses COL<1:2>.

The flag signal generation circuit 240 may generate the flag signal FLAG, which is disabled to a logic low level as the first write command WTA is input.

The shifting clock generation circuit 251 may generate the first shifting rising clock SCKR<1>, which is generated at a logic high level, from the first write command WTA in synchronization with the internal clock ICLK.

The serializer 261 may generate the rising address RAD from the first bank group address BG<1> by the first shifting rising clock SCKR<1> in synchronization with the internal clock ICLK. At this time, the rising address RAD may be generated at the same logic level as the first bank group address BG<1>. For the sake of convenience in explanation, it is assumed that there is no internal shifting amount for shifting the pre-rising address RAD_PRE and the pre-falling address FAD_PRE, which are serialized in the serializer 261.

At time T12, the shifting clock generation circuit 251 may generate the first shifting falling clock SCKF<1>, which is generated at a logic high level, by shifting the first shifting rising clock SCKR<1> in synchronization with the internal clock ICLK.

The serializer 261 may generate the falling address FAD from the second bank address BA<2> by the first shifting falling clock SCKF<1> in synchronization with the internal clock ICLK. At this time, the falling address FAD may be generated at the same logic level as the second bank address BA<2>.

At time T13, the shifting clock generation circuit 251 may generate the second shifting rising clock SCKR<2>, which is generated at a logic high level, based on the first shifting rising clock SCKR<1> in synchronization with the internal clock ICLK.

The serializer 261 may generate the rising address RAD from the second bank group address BG<2> based on the second shifting rising clock SCKR<2> in synchronization with the internal clock ICLK. At this time, the rising address RAD may be generated at the same logic level as the second bank group address BG<2>.

At time T14, the shifting clock generation circuit 251 may generate the second shifting falling clock SCKF<2>, which is generated at a logic high level, by shifting the second shifting rising clock SCKR<2> in synchronization with the internal clock ICLK.

The serializer 261 may generate the falling address FAD from the first column address COL<1> by the second shifting falling clock SCKF<2> in synchronization with the internal clock ICLK. At this time, the falling address FAD may be generated at the same logic level as the first column address COL<1>.

At time T15, the shifting clock generation circuit 251 may generate the third shifting rising clock SCKR<3>, which is generated at a logic high level, from the second shifting rising clock SCKR<2> in synchronization with the internal clock ICLK.

The serializer 261 may generate the rising address RAD from the flag signal FLAG based on the third shifting rising clock SCKR<3> in synchronization with the internal clock ICLK. At this time, the rising address RAD is generated at a logic low level like the flag signal FLAG.

At time T16, the shifting clock generation circuit 251 may generate the third shifting falling clock SCKF<3>, which is generated at a logic high level, by shifting the third shifting rising clock SCKR<3> in synchronization with the internal clock ICLK.

The serializer 261 may generate the falling address FAD from the second column address COL<2> based on the third shifting falling clock SCKF<3> in synchronization with the internal clock ICLK. At this time, the falling address FAD may be generated at the same logic level as the second column address COL<2>.

At time T17, the shifting clock generation circuit 251 may generate the fourth shifting rising clock SCKR<4>, which is generated at a logic high level, from the third shifting rising clock SCKR<3> in synchronization with the internal clock ICLK.

The serializer 261 may generate the rising address RAD from the first bank address BA<1> based on the fourth shifting rising clock SCKR<4> in synchronization with the internal clock ICLK. At this time, the rising address RAD may be generated at the same logic level as the first bank address BA<1>.

At time T18, the shifting clock generation circuit 251 may generate the write shifting signal WTS, which is generated at a logic high level, from the fourth shifting rising clock SCKR<4> in synchronization with the internal clock ICLK.

As such, the semiconductor device 120 may generate the rising address RAD and the falling address FAD by serializing the flag signal FLAG, which is disabled when the command CMD is input in synchronization with the rising edge of the clock CLK, the first and second bank group addresses BG<1:2>, the first and second bank addresses BA<1:2>, and the first and second column addresses COL<1:2>.

Next, the case in which the controller 110 outputs the command CMD and the address ADD for performing the write auto-precharge operation, in synchronization with the falling edge of the clock CLK, will be described below as an example.

At time T19, the command decoder 220 may receive the command CMD and may generate the second write command WTB for performing the write auto-precharge operation.

The address input circuit 230 may receive the first to sixth addresses ADD<1:6> and may generate the first and second bank group addresses BG<1:2>, the first and second bank addresses BA<1:2>, and the first and second column addresses COL<1:2>.

The flag signal generation circuit 240 may generate the flag signal FLAG, which is enabled to a logic high level, as the second write command WTB is input.

At time T20, the shifting clock generation circuit 251 may generate the first shifting rising clock SCKR<1>, which is generated at a logic high level, from the second write command WTB in synchronization with the internal clock ICLK.

The serializer 261 may generate the rising address RAD from the first bank group address BG<1> by the first shifting rising clock SCKR<1> in synchronization with the internal clock ICLK. At this time, the rising address RAD may be generated at the same logic level as the first bank group address BG<1>.

At time T21, the shifting clock generation circuit 251 may generate the first shifting falling clock SCKF<1>, which is generated at a logic high level, by shifting the first shifting rising clock SCKR<1> in synchronization with the internal clock ICLK.

The serializer 261 may generate the falling address FAD from the second bank address BA<2> based on the first shifting falling clock SCKF<1> in synchronization with the internal clock ICLK. At this time, the falling address FAD is generated at the same logic level as the second bank address BA<2>.

At time T22, the shifting clock generation circuit 251 may generate the second shifting rising clock SCKR<2>, which is generated at a logic high level, from the first shifting rising clock SCKR<1> in synchronization with the internal clock ICLK.

The serializer 261 may generate the rising address RAD from the second bank group address BG<2> based on the second shifting rising clock SCKR<2> in synchronization with the internal clock ICLK. At this time, the rising address RAD may be generated at the same logic level as the second bank group address BG<2>.

At time T23, the shifting clock generation circuit 251 may generate the second shifting falling clock SCKF<2>, which is generated at a logic high level, by shifting the second shifting rising clock SCKR<2> in synchronization with the internal clock ICLK.

The serializer 261 may generate the falling address FAD from the first column address COL<1> based on the second shifting falling clock SCKF<2> in synchronization with the internal clock ICLK. At this time, the falling address FAD may be generated at the same logic level as the first column address COL<1>.

At time T24, the shifting clock generation circuit 251 may generate the third shifting rising clock SCKR<3>, which is generated at a logic high level, from the second shifting rising clock SCKR<2> in synchronization with the internal clock ICLK.

The serializer 261 may generate the rising address RAD from the flag signal FLAG based on the third shifting rising clock SCKR<3> in synchronization with the internal clock ICLK. At this time, the rising address RAD is generated at a logic high level like the flag signal FLAG.

At time T25, the shifting clock generation circuit 251 may generate the third shifting falling clock SCKF<3>, which is generated at a logic high level, by shifting the third shifting rising clock SCKR<3> in synchronization with the internal clock ICLK.

The serializer 261 may generate the falling address FAD from the second column address COL<2> based on the third shifting falling clock SCKF<3> in synchronization with the internal clock ICLK. At this time, the falling address FAD may be generated at the same logic level as the second column address COL<2>.

At time T26, the shifting clock generation circuit 251 may generate the fourth shifting rising clock SCKR<4>, which is generated at a logic high level, from the third shifting rising clock SCKR<3> in synchronization with the internal clock ICLK.

The serializer 261 may generate the rising address RAD from the first bank address BA<1> based on the fourth shifting rising clock SCKR<4> in synchronization with the internal clock ICLK. At this time, the rising address RAD may be generated at the same logic level as the first bank address BA<1>.

At time T27, the shifting clock generation circuit 251 may generate the write shifting signal WTS, which is generated at a logic high level, from the fourth shifting rising clock SCKR<4> in synchronization with the internal clock ICLK.

As such, the semiconductor device 120 may generate the rising address RAD and the falling address FAD by serializing the flag signal FLAG, which is enabled when the command CMD is input in synchronization with the falling edge of the clock CLK, the first and second bank group addresses BG<1:2>, the first and second bank addresses BA<1:2> and the first and second column addresses COL<1:2>.

Figure 18:
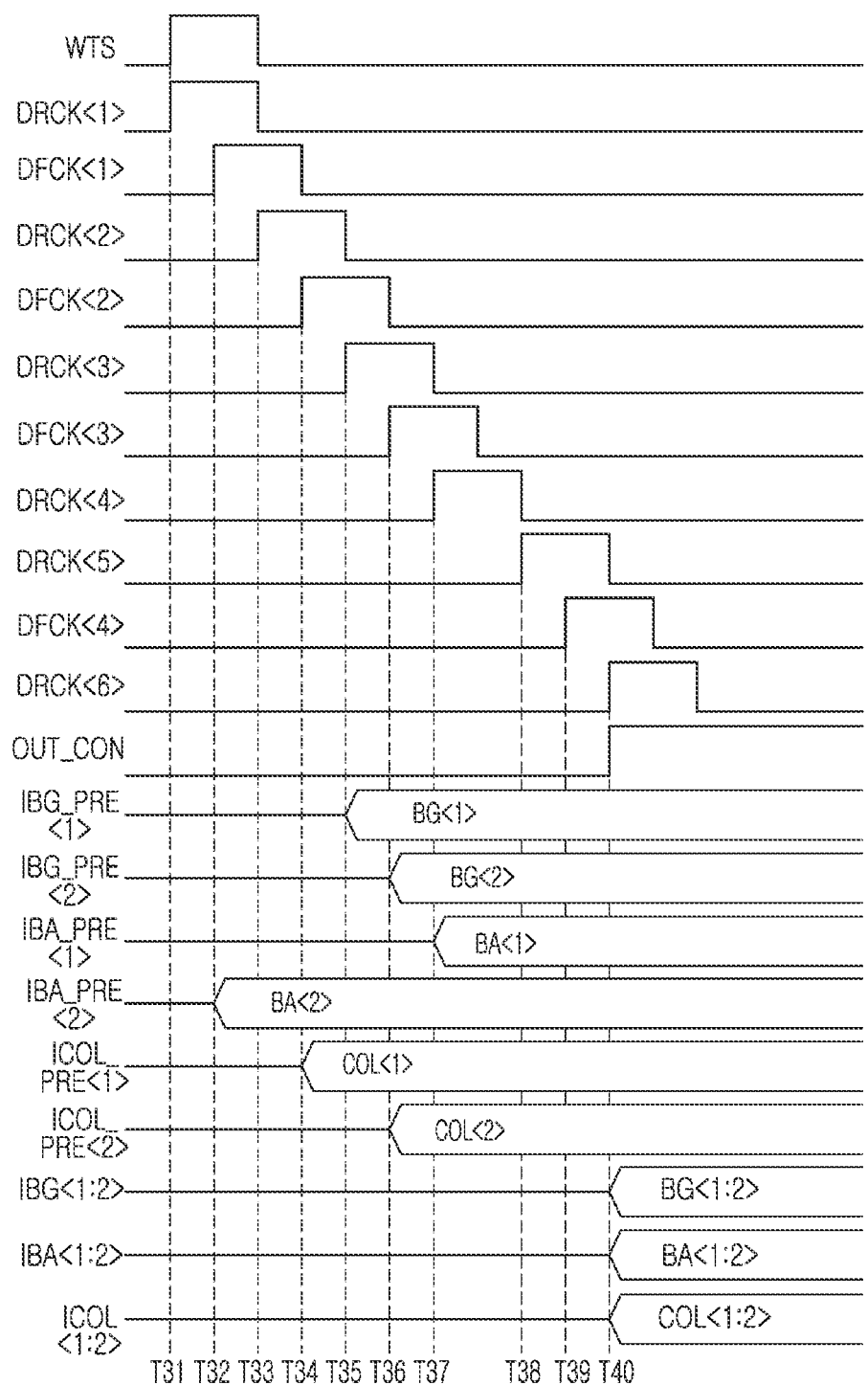

With reference to FIG. 18, the operation of parallelizing a rising address and a falling address, generated in series, in the write auto-precharge operation of the semiconductor system 100 in accordance with the embodiment of the disclosure will be described below, based on a case in which the command CMD and the address ADD are input at the rising edge of the clock CLK.

It is assumed that time T31 is set as the same time as time T18 that is described above with reference to FIG. 17.

At time T31, the shifting clock generation circuit 251 may generate the write shifting signal WTS, which is generated at a logic high level, from the fourth shifting rising clock SCKR<4> in synchronization with the internal clock ICLK.

The delay clock generation circuit 262_1 may generate the first rising delay clock DRCK<1>, which is generated at a logic high level, from the write shifting signal WTS.

At time T32, the delay clock generation circuit 262_1 may generate the first falling delay clock DFCK<1>, which is generated at a logic high level, from the first rising delay clock DRCK<1>.

The pre-internal address generation circuit 262_23 of the alignment circuit 262_2 may generate the second pre-internal bank address IBA_PRE<2> from the input falling address IN_FAD by the first falling delay clock DFCK<1>. At this time, the second pre-internal bank address IBA_PRE<2> may be generated at the same logic level as the second bank address BA<2>.

At time T33, the delay clock generation circuit 262_1 may generate the second rising delay clock DRCK<2>, which is generated at a logic high level, from the first rising delay clock DRCK<1>.

At time T34, the delay clock generation circuit 262_1 may generate the second falling delay clock DFCK<2>, which is generated at a logic high level, from the second rising delay clock DRCK<2>.

The pre-internal address generation circuit 262_23 of the alignment circuit 2622 may generate the first pre-internal column address ICOL_PRE<1> from the input falling address IN_FAD by the second falling delay clock DFCK<2>. At this time, the first pre-internal column address ICOL_PRE<1> may be generated at the same logic level as the first column address COL<1>.

At time T35, the delay clock generation circuit 262_1 may generate the third rising delay clock DRCK<3>, which is generated at a logic high level, from the second rising delay clock DRCK<2>.

The pre-internal address generation circuit 262_23 of the alignment circuit 262_2, the first pre-internal bank group address IBG_PRE<1> from the input rising address IN_RAD by the third rising delay clock DRCK<3>. At this time, the first pre-internal bank group address IBG_PRE<1> may be generated at the same logic level as the first bank group address BG<1>.

At time T36, the delay clock generation circuit 262_1 may generate the third falling delay clock DFCK<3>, which is generated at a logic high level, from the third rising delay clock DRCK<3>.

The pre-internal address generation circuit 262_23 of the alignment circuit 2622 may generate the second pre-internal bank group address IBG_PRE<2> from the input rising address IN_RAD by the third falling delay clock DFCK<3>. At this time, the second pre-internal bank group address IBG_PRE<2> may be generated at the same logic level as the second bank group address BG<2>.

The pre-internal address generation circuit 262_23 of the alignment circuit 262_2 may generate the second pre-internal column address ICOL_PRE<2> from the input falling address IN_FAD by the third falling delay clock DFCK<3>. At this time, the second pre-internal column address ICOL_PRE<2> may be generated at the same logic level as the second column address COL<2>.

At time T37, the delay clock generation circuit 262_1 may generate the fourth rising delay clock DRCK<4>, which is generated at a logic high level, from the third rising delay clock DRCK<3>.

The pre-internal address generation circuit 262_23 of the alignment circuit 262_2 may generate the first pre-internal bank address IBA_PRE<1> from the input rising address IN_RAD by the fourth rising delay clock DRCK<4>. At this time, the first pre-internal bank address IBA_PRE<1> may be generated at the same logic level as the first bank address BA<1>.

At time T38, the delay clock generation circuit 262_1 may generate the fifth rising delay clock DRCK<5>, which may be generated at a logic high level, from the fourth rising delay clock DRCK<4>.

At time T39, the delay clock generation circuit 262_1 may generate the fourth falling delay clock DFCK<4>, which is generated at a logic high level, from the fifth rising delay clock DRCK<5>.

At time T40, the delay clock generation circuit 262_1 may generate the sixth rising delay clock DRCK<6>, which is generated at a logic high level, from the fifth rising delay clock DRCK<5>.

The selective output circuit 262_13 of the delay clock generation circuit 262_1 may output the sixth rising delay clock DRCK<6> as the output control signal OUT_CON by the delay flag signal FLAGD with a logic low level.

The address output circuit 262_24 of the alignment circuit 262_2 may generate the first and second internal bank group addresses IBG<1:2>, the first and second internal bank addresses IBA<1:2>, and the first and second internal column addresses ICOL<1:2> based on the first and second pre-internal bank group addresses IBG_PRE<1:2>, the first and second pre-internal bank addresses IBA_PRE<1:2>, and the first and second pre-internal column addresses ICOL_PRE<1:2> based on the output control signal OUT_CON with a logic high level.

The first bank group BG1, the second bank group BG2, the third bank group BG3, and the fourth bank group BG4 of the core circuit 270 may be selectively activated and may perform the write auto-precharge operation based on a logic level combination of the first and second internal bank group addresses IBG<1:2>, the first and second internal bank addresses IBA<1:2>, and the first and second internal column addresses ICOL<1:2>.

As such, the semiconductor device 120 may generate the first and second internal bank group addresses IBG<1:2>, the first and second internal bank addresses IBA<1:2>, and the first and second internal column addresses ICOL<1:2> by adjusting the parallelization times of the flag signal FLAG, the first and second bank group addresses BG<1:2>, the first and second bank addresses BA<1:2> and the first and second column addresses COL<1:2>, which are serialized, based on the input time of the command CMD. In the semiconductor device 120, any one of the first to fourth bank groups BG1 to BG4 may be activated and may perform the write auto-precharge operation based on the logic level combination of the first and second internal bank group addresses IBG<1:2>, the first and second internal bank addresses IBA<1:2>, and the first and second internal column addresses ICOL<1:2>, which are parallelized.

Figure 19:
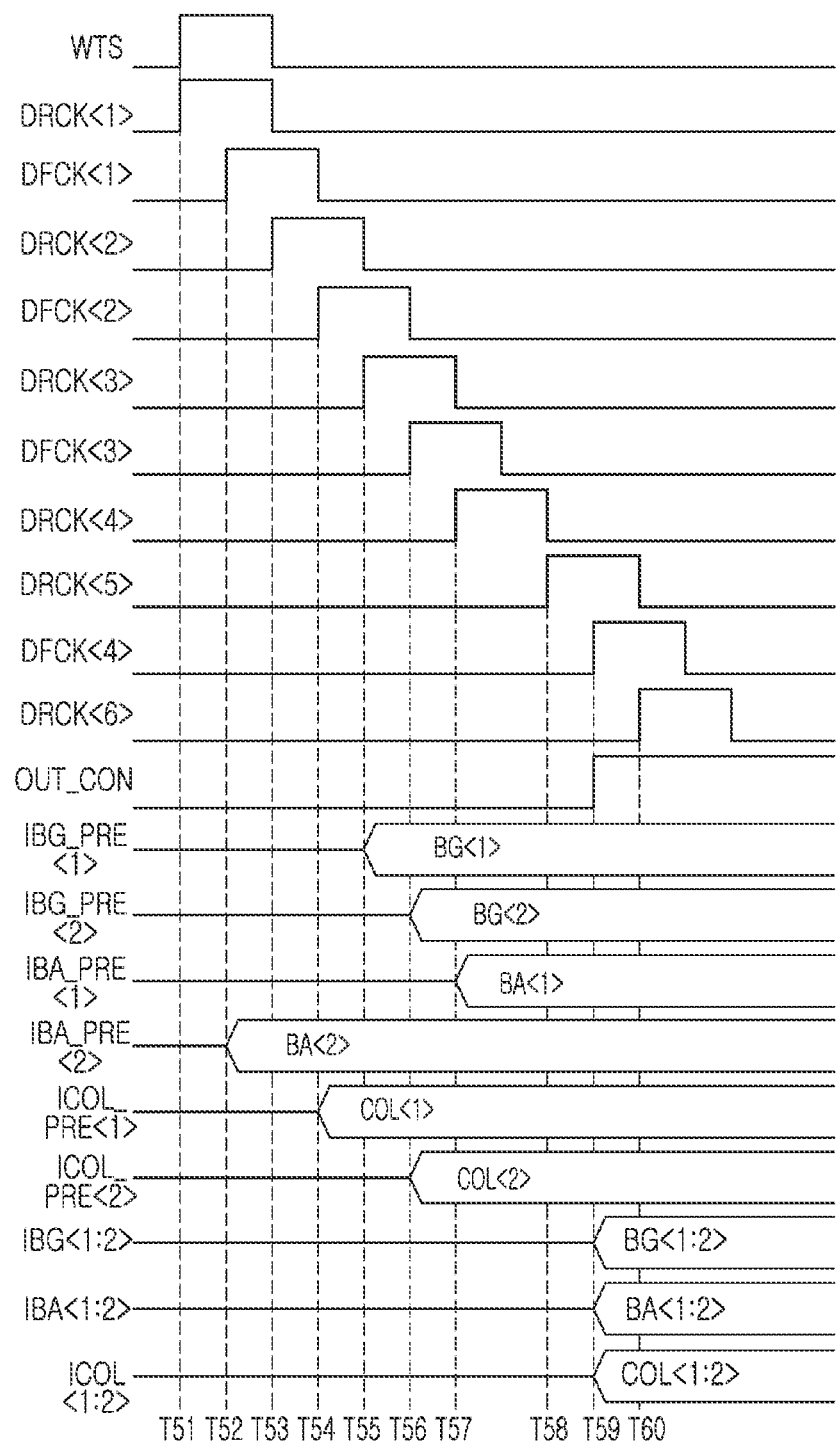

With reference to FIG. 19, the operation of parallelizing a rising address and a falling address, generated in series, in the write auto-precharge operation of the semiconductor system 100 in accordance with the embodiment of the disclosure will be described below, based on a case in which the command CMD and the address ADD are input at the falling edge of the clock CLK.

Before making description, it is assumed that a time T51 is set as the same time as the time T27 described above with reference to FIG. 17.

At time T51, the shifting clock generation circuit 251 may generate the write shifting signal WTS, which is generated at a logic high level, from the fourth shifting rising clock SCKR<4> in synchronization with the internal clock ICLK.

The delay clock generation circuit 262_1 may generate the first rising delay clock DRCK<1>, which is generated at a logic high level, from the write shifting signal WTS.

At time T52, the delay clock generation circuit 262_1 may generate the first falling delay clock DFCK<1>, which is generated at a logic high level, from the first rising delay clock DRCK<1>.

The pre-internal address generation circuit 262_23 of the alignment circuit 262_2 may generate the second pre-internal bank address IBA_PRE<2> from the input falling address IN_FAD based on the first falling delay clock DFCK<1>. At this time, the second pre-internal bank address IBA_PRE<2> may be generated at the same logic level as the second bank address BA<2>.

At time T53, the delay clock generation circuit 262_1 may generate the second rising delay clock DRCK<2>, which is generated at a logic high level, from the first rising delay clock DRCK<1>.

At time T54, the delay clock generation circuit 262_1 may generate the second falling delay clock DFCK<2>, which is generated at a logic high level, from the second rising delay clock DRCK<2>.

The pre-internal address generation circuit 262_23 of the alignment circuit 2622 may generate the first pre-internal column address ICOL_PRE<1> from the input falling address IN_FAD based on the second falling delay clock DFCK<2>. At this time, the first pre-internal column address ICOL_PRE<1> may be generated at the same logic level as the first column address COL<1>.

At time T55, the delay clock generation circuit 262_1 may generate the third rising delay clock DRCK<3>, which is generated at a logic high level, from the second rising delay clock DRCK<2>.

The pre-internal address generation circuit 262_23 of the alignment circuit 262_2 may generate the first pre-internal bank group address IBG_PRE<1> from the input rising address IN_RAD based on the third rising delay clock DRCK<3>. At this time, the first pre-internal bank group address IBG_PRE<1> may be generated at the same logic level as the first bank group address BG<1>.

At time T56, the delay clock generation circuit 262_1 may generate the third falling delay clock DFCK<3>, which is generated at a logic high level, from the third rising delay clock DRCK<3>.

The pre-internal address generation circuit 262_23 of the alignment circuit 262_2 may generate the second pre-internal bank group address IBG_PRE<2> from the input rising address IN_RAD based on the third falling delay clock DFCK<3>. At this time, the second pre-internal bank group address IBG_PRE<2> may be generated at the same logic level as the second bank group address BG<2>.

The pre-internal address generation circuit 262_23 of the alignment circuit 262_2 may generate the second pre-internal column address ICOL_PRE<2> from the input falling address IN_FAD based on the third falling delay clock DFCK<3>. At this time, the second pre-internal column address ICOL_PRE<2> may be generated at the same logic level as the second column address COL<2>.

At time T57, the delay clock generation circuit 262_1 may generate the fourth rising delay clock DRCK<4>, which is generated at a logic high level, from the third rising delay clock DRCK<3>.

The pre-internal address generation circuit 262_23 of the alignment circuit 262_2 may generate the first pre-internal bank address IBA_PRE<1> from the input rising address IN_RAD based on the fourth rising delay clock DRCK<4>. At this time, the first pre-internal bank address IBA_PRE<1> may be generated at the same logic level as the first bank address BA<1>.

At time T58, the delay clock generation circuit 262_1 may generate the fifth rising delay clock DRCK<5>, which is generated at a logic high level, from the fourth rising delay clock DRCK<4>.

At time T59, the delay clock generation circuit 262_1 may generate the fourth falling delay clock DFCK<4>, which is generated at a logic high level, from the fifth rising delay clock DRCK<5>.

The selective output circuit 262_13 of the delay clock generation circuit 262_1 may output the fourth falling delay clock DFCK<4> as the output control signal OUT_CON based on the delay flag signal FLAGD with a logic high level.

The address output circuit 262_24 of the alignment circuit 262_2 may generate the first and second internal bank group addresses IBG<1:2>, the first and second internal bank addresses IBA<1:2>, and the first and second internal column addresses ICOL<1:2> based on the first and second pre-internal bank group addresses IBG_PRE<1:2>, the first and second pre-internal bank addresses IBA_PRE<1:2>, the first and second pre-internal column addresses ICOL_PRE<1:2>, and the output control signal OUT_CON with a logic high level.

The first bank group BG1, the second bank group BG2, the third bank group BG3, and the fourth bank group BG4 of the core circuit 270 may be selectively activated and may perform the write auto-precharge operation based on a logic level combination of the first and second internal bank group addresses IBG<1:2>, the first and second internal bank addresses IBA<1:2>, and the first and second internal column addresses ICOL<1:2>.

At time T60, the delay clock generation circuit 262_1 may generate the sixth rising delay clock DRCK<6>, which is generated at a logic high level, from the fifth rising delay clock DRCK<5>.

As such, the semiconductor device 120 may generate the first and second internal bank group addresses IBG<1:2>, the first and second internal bank addresses IBA<1:2>, and the first and second internal column addresses ICOL<1:2> by adjusting the parallelization times of the flag signal FLAG, the first and second bank group addresses BG<1:2>, the first and second bank addresses BA<1:2>, and the first and second column addresses COL<1:2>, which are serialized, based on an input time of the command CMD. In the semiconductor device 120, any one of the first to fourth bank groups BG1 to BG4 may be activated and may perform the write auto-precharge operation based on a logic level combination of the first and second internal bank group addresses IBG<1:2>, the first and second internal bank addresses IBA<1:2>, and the first and second internal column addresses ICOL<1:2>, which are parallelized.

The semiconductor system 100, in accordance with the embodiment of the disclosure may serialize addresses, based on the time at which the command CMD is input, and then may generate internal addresses by parallelizing the serialized addresses, thereby performing a write auto-precharge operation and a read auto-precharge operation. Also, in the semiconductor system 100, in accordance with the embodiment of the disclosure, by serializing addresses that are input in parallel and then generating internal addresses by parallelizing the serialized addresses, the number of flip-flops for latching and shifting addresses may be reduced, and thus, the area may be reduced.

Figure 20:
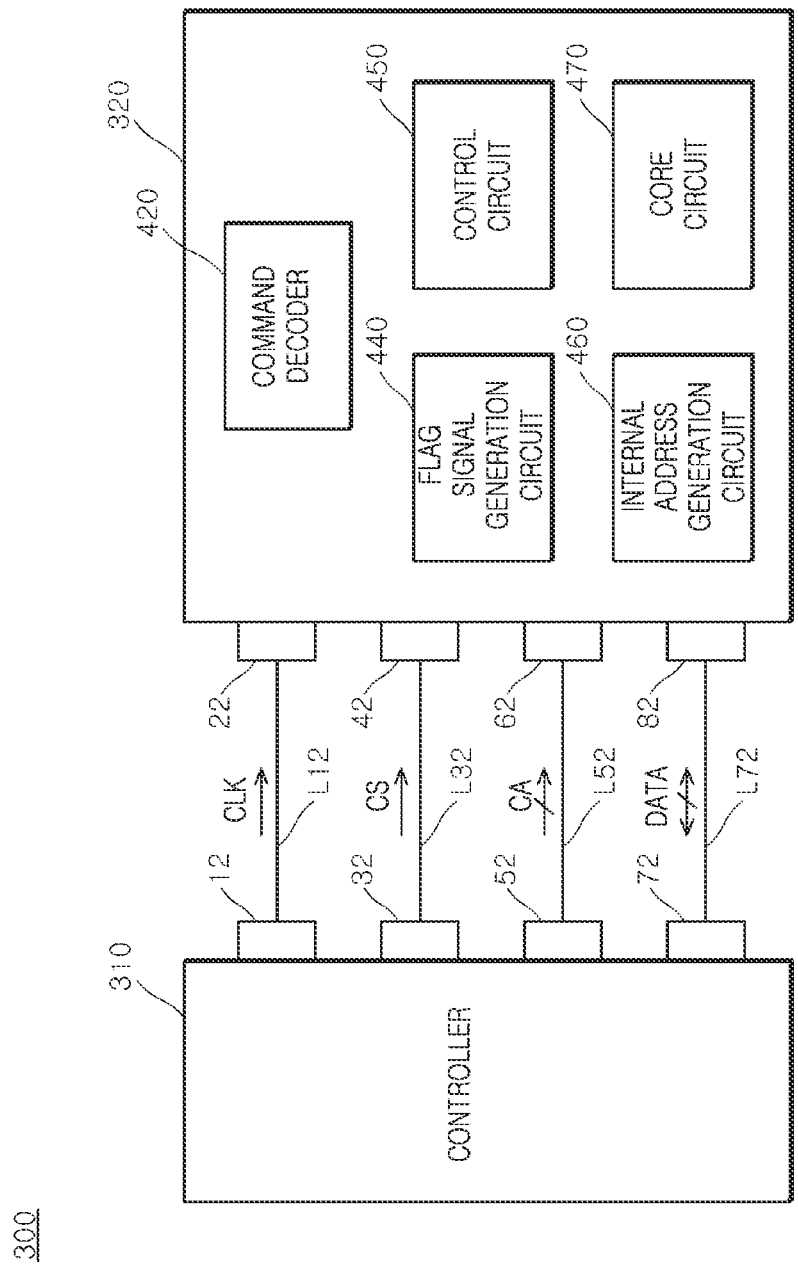
FIG. 20 is a block diagram illustrating a configuration of a semiconductor system in accordance with another embodiment of the disclosure.

As illustrated in FIG. 20, a semiconductor system 300 in accordance with another embodiment of the disclosure may include a controller 310 and a semiconductor device 320. The semiconductor device 320 may include a command decoder 420, a flag signal generation circuit 440, a control circuit 450, an internal address generation circuit 460, and a core circuit 470.

The controller 310 may include a first control pin 12, a second control pin 32, a third control pin 52, and a fourth control pin 72. The semiconductor device 320 may include a first semiconductor pin 22, a second semiconductor pin 42, a third semiconductor pin 62, and a fourth semiconductor pin 82. A first transmission line L12 may be coupled between the first control pin 12 and the first semiconductor pin 22. A second transmission line L32 may be coupled between the second control pin 32 and the second semiconductor pin 42. A third transmission line L52 may be coupled between the third control pin 52 and the third semiconductor pin 62. A fourth transmission line L72 may be coupled between the fourth control pin 72 and the fourth semiconductor pin 82. The controller 310 may transmit a clock CLK to the semiconductor device 320 through the first transmission line L12 in order to control the semiconductor device 320. The controller 310 may transmit a chip select signal CS to the semiconductor device 320 through the second transmission line L32 in order to control the semiconductor device 320. The controller 310 may transmit a command address CA to the semiconductor device 320 through the third transmission line L52 in order to control the semiconductor device 320. The controller 310 and the semiconductor device 320 may transmit and receive data DATA through the fourth transmission line L72.

The controller 310 may output the clock CLK, the chip select signal CS, the command address CA, and the data DATA to the semiconductor device 320 for performing a write auto-precharge operation and a read auto-precharge operation. The write auto-precharge operation may be set as an operation of automatically performing a precharge operation after a write operation of the semiconductor device 320. The read auto-precharge operation may be set as an operation of automatically performing a precharge operation after a read operation of the semiconductor device 320.

The command decoder 420 may generate first and second write commands WTA and WTB (see FIG. 21) when a logic level combination of the chip select signal CS and the command address CA is a logic level combination for performing the write auto-precharge operation. The command decoder 420 may generate first and second read commands RDA and RDB (see FIG. 21) when a logic level combination of the chip select signal CS and the command address CA is a logic level combination for performing the read auto-precharge operation.

The flag signal generation circuit 440 may generate a flag signal FLAG (see FIG. 21) with information on an input time of the command address CA. When the command address CA is input in synchronization with the rising edge of the clock CLK, the flag signal generation circuit 440 may generate the flag signal FLAG (see FIG. 21) that is disabled. When the command address CA is input in synchronization with the falling edge of the clock CLK, the flag signal generation circuit 440 may generate the flag signal FLAG (see FIG. 21) that is enabled.

Figure 21:
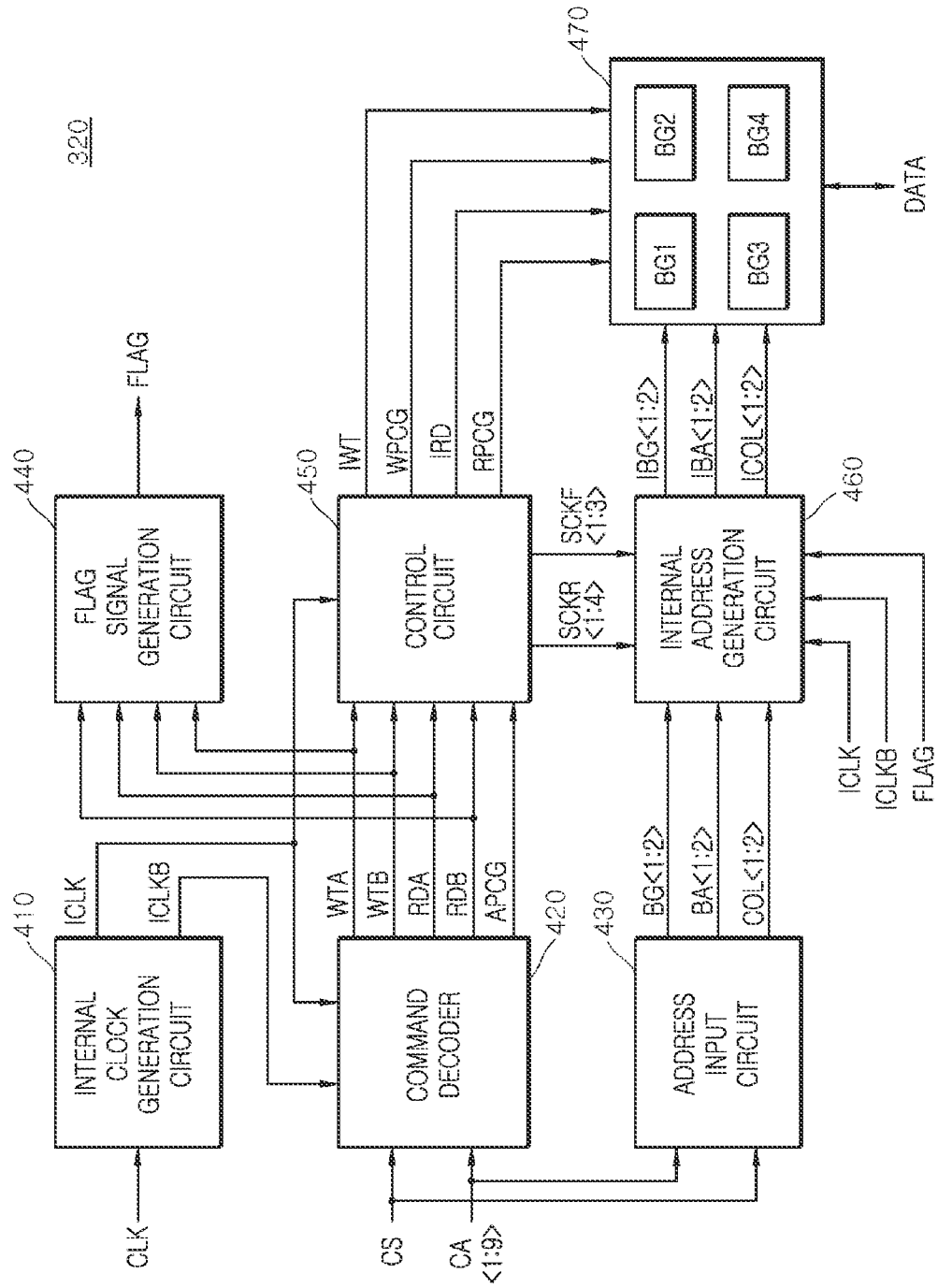
FIG. 21 is a block diagram illustrating a configuration of a semiconductor device included in the semiconductor system illustrated in FIG. 20.

The control circuit 450 may shift the first and second write commands WTA and WTB (see FIG. 21) that are generated by the command address CA, and thereby generate first to fourth shifting rising clocks SCKR<1:4> (see FIG. 21) and first to third shifting falling clocks SCKF<1:3> (see FIG. 21). The control circuit 450 may shift the first and second read commands RDA and RDB (see FIG. 21) that are generated by the command address CA, and thereby generate first to fourth shifting rising clocks SCKR<1:4> (see FIG. 21) and first to third shifting falling clocks SCKF<1:3> (see FIG. 21).

The internal address generation circuit 460 may serialize first and second bank group addresses BG<1:2> (see FIG. 21), first and second bank addresses BA<1:2> (see FIG. 21), and first and second column addresses COL<1:2> (see FIG. 21), which are generated from the command address CA, based on the first to fourth shifting rising clocks SCKR<1:4> and the first to third shifting falling clocks SCKF<1:3>. The internal address generation circuit 460 may parallelize the flag signal FLAG (see FIG. 21) and the first and second bank group addresses BG<1:2> (see FIG. 21), the first and second bank addresses BA<1:2> (see FIG. 21) and the first and second column addresses COL<1:2> (see FIG. 21), which are serialized, and thereby generate first and second internal bank group addresses IBG<1:2> (see FIG. 21), first and second internal bank addresses IBA<1:2> (see FIG. 21), and first and second internal column addresses ICOL<1:2> (see FIG. 21).

The core circuit 470 may perform the write auto-precharge operation based on the first and second internal bank group addresses IBG<1:2> (see FIG. 21), the first and second internal bank addresses IBA<1:2> (see FIG. 21), and the first and second internal column addresses ICOL<1:2> (see FIG. 21) after the write operation. The core circuit 470 may perform the read auto-precharge operation based on the first and second internal bank group addresses IBG<1:2> (see FIG. 21), the first and second internal bank addresses IBA<1:2> (see FIG. 21), and the first and second internal column addresses ICOL<1:2> (see FIG. 21) after the read operation.

FIG. 21 is a block diagram illustrating a configuration of the semiconductor device 320 in accordance with another embodiment of the disclosure. As illustrated in FIG. 21, the semiconductor device 320 may include an internal clock generation circuit 410, the command decoder 420, an address input circuit 430, the flag signal generation circuit 440, the control circuit 450, the internal address generation circuit 460, and the core circuit 470.

The internal clock generation circuit 410 may receive the clock CLK and generate an internal clock ICLK and an inverted internal clock ICLKB. The internal clock generation circuit 410 may generate the internal clock ICLK, which has the same phase as the clock CLK. The internal clock generation circuit 410 may generate the inverted internal clock ICLKB, which has a phase opposite to that of the clock CLK. The internal clock generation circuit 410, illustrated in FIG. 21, may be implemented with the same circuit and may perform the same operation as the internal clock generation circuit 210, illustrated in FIG. 2.

The command decoder 420 may receive the chip select signal CS and first to ninth command addresses CA<1:9> and may generate the first write command WTA, the second write command WTB, and an auto-precharge signal APCG for performing the write auto-precharge operation. When a logic level combination of the chip select signal CS and the first to ninth command addresses CA<1:9> is a logic level combination for performing the write auto-precharge operation and the first to ninth command addresses CA<1:9> are input in synchronization with the rising edge of the internal clock ICLK, the command decoder 420 may generate the first write command WTA and the auto-precharge signal APCG, which are enabled. When a logic level combination of the chip select signal CS and the first to ninth command addresses CA<1:9> is a logic level combination for performing the write auto-precharge operation and the first to ninth command addresses CA<1:9> are input in synchronization with the rising edge of the inverted internal clock ICLKB, the command decoder 420 may generate the second write command WTB and the auto-precharge signal APCG which are enabled. The logic level combination of the chip select signal CS and the first to ninth command addresses CA<1:9> for performing the write auto-precharge operation will be described later in detail with reference to FIG. 22.

The command decoder 420 may receive the chip select signal CS and first to ninth command addresses CA<1:9> and may generate the first read command RDA, the second read command RDB, and the auto-precharge signal APCG for performing the read auto-precharge operation. When a logic level combination of the chip select signal CS and the first to ninth command addresses CA<1:9> is a logic level combination for performing the read auto-precharge operation and the first to ninth command addresses CA<1:9> are input in synchronization with the rising edge of the internal clock ICLK, the command decoder 420 may generate the first read command RDA and the auto-precharge signal APCG, which are enabled. When a logic level combination of the chip select signal CS and the first to ninth command addresses CA<1:9> is a logic level combination for performing the read auto-precharge operation and the first to ninth command addresses CA<1:9> are input in synchronization with the rising edge of the inverted internal clock ICLKB, the command decoder 420 may generate the second read command RDB and the auto-precharge signal APCG which are enabled. A logic level combination of the chip select signal CS and the first to ninth command addresses CA<1:9> for performing the read auto-precharge operation will be described later in detail with reference to FIG. 22.

The address input circuit 430 may receive the chip select signal CS and the first to ninth command addresses CA<1:9> and may generate the first and second bank group addresses BG<1:2>, the first and second bank addresses BA<1:2>, and the first and second column addresses COL<1:2>. The chip select signal CS and the first to ninth command addresses CA<1:9> that are used by the address input circuit 430 to generate the first and second bank group addresses BG<1:2>, the first and second bank addresses BA<1:2>, and the first and second column addresses COL<1:2> will be described later in detail with reference to FIG. 22.

The flag signal generation circuit 440 may generate the flag signal FLAG based on the first write command WTA and the second write command WTB. The flag signal generation circuit 440 may generate the flag signal FLAG, which is disabled, when the first write command WTA is input. The flag signal generation circuit 440 may generate the flag signal FLAG, which is enabled, when the second write command WTB is input. The flag signal generation circuit 440 may generate the flag signal FLAG based on the first read command RDA and the second read command RDB. The flag signal generation circuit 440 may generate the flag signal FLAG, which is disabled, when the first read command RDA is input. The flag signal generation circuit 440 may generate the flag signal FLAG, which is enabled, when the second read command RDB is input. The flag signal generation circuit 440 may be implemented to generate the flag signal FLAG based on the first read command RDA and the second read command RDB instead of the first write command WTA and the second write command WTB in the flag signal generation circuit 240, illustrated in FIGS. 2 and 4.

The control circuit 450 may generate the first to fourth shifting rising clocks SCKR<1:4> and the first to third shifting falling clocks SCKF<1:3> based on the first write command WTA and the second write command WTB in synchronization with the internal clock ICLK. The control circuit 450 may generate an internal write command IWT and a write auto-precharge signal WPCG for performing the write auto-precharge operation based on the first write command WTA and the second write command WTB. The control circuit 450 may generate the first to fourth shifting rising clocks SCKR<1:4> and the first to third shifting falling clocks SCKF<1:3> based on the first read command RDA and the second read command RDB in synchronization with the internal clock ICLK. The control circuit 450 may generate an internal read command IRD and a read auto-precharge signal RPCG for performing the read auto-precharge operation based on the first read command RDA and the second read command RDB.

The control circuit 450 may be implemented to generate the first to fourth shifting rising clocks SCKR<1:4>, the first to third shifting falling clocks SCKF<1:3>, the internal read command IRD, and the read auto-precharge signal RPCG based on the first read command RDA and the second read command RDB instead of the first write command WTA and the second write command WTB in the control circuit 250, illustrated in FIGS. 2 and 5 to 9.

The internal address generation circuit 460 may serialize the flag signal FLAG, the first and second bank group addresses BG<1:2>, the first and second bank addresses BA<1:2>, and the first and second column addresses COL<1:2> in synchronization with the first to fourth shifting rising clocks SCKR<1:4> and the first to third shifting falling clocks SCKF<1:3>. The internal address generation circuit 460 may parallelize the flag signal FLAG, the first and second bank group addresses BG<1:2>, the first and second bank addresses BA<1:2>, and the first and second column addresses COL<1:2>, which are serialized, in synchronization with the internal clock ICLK and the inverted internal clock ICLKB, and thereby generate the first and second internal bank group addresses IBG<1:2>, the first and second internal bank addresses IBA<1:2>, and the first and second internal column addresses ICOL<1:2>.

Since the internal address generation circuit 460 is implemented with the same circuit and performs the same operation as the internal address generation circuit 260, illustrated in FIGS. 10 to 16, detailed description thereof will be omitted herein.

The core circuit 470 may include a first bank group BG1, a second bank group BG2, a third bank group BG3, and a fourth bank group BG4. The first bank group BG1, the second bank group BG2, the third bank group BG3, and the fourth bank group BG4 may be selectively activated based on the logic level combination of the first and second internal bank group addresses IBG<1:2>. For example, when the first internal bank group address IBG<1> is a logic low level and the second internal bank group address IBG<2> is a logic low level, the first bank group BG1 may be activated.

When the internal write command IWT and the write auto-precharge signal WPCG are input and the first bank group BG1 is activated by the first and second internal bank group addresses IBG<1:2>, the first bank group BG1 may perform a precharge operation after performing a write operation of storing data DATA in a memory cell (not illustrated) that is selected by the first and second internal bank addresses IBA<1:2> and the first and second internal column addresses ICOL<1:2>. When the internal read command IRD and the read auto-precharge signal RPCG are input and the first bank group BG1 is activated by the first and second internal bank group addresses IBG<1:2>, the first bank group BG1 may perform a precharge operation after performing a read operation of outputting data DATA that is stored in a memory cell (not illustrated) that is selected by the first and second internal bank addresses IBA<1:2> and the first and second internal column addresses ICOL<1:2>.

When the internal write command IWT and the write auto-precharge signal WPCG are input and the second bank group BG2 is activated by the first and second internal bank group addresses IBG<1:2>, the second bank group BG2 may perform a precharge operation after performing a write operation of storing data DATA in a memory cell (not illustrated) that is selected by the first and second internal bank addresses IBA<1:2> and the first and second internal column addresses ICOL<1:2>. When the internal read command IRD and the read auto-precharge signal RPCG are input and the second bank group BG2 is activated by the first and second internal bank group addresses IBG<1:2>, the second bank group BG2 may perform a precharge operation after performing a read operation of outputting data DATA stored in a memory cell (not illustrated) that is selected by the first and second internal bank addresses IBA<1:2> and the first and second internal column addresses ICOL<1:2>.

When the internal write command IWT and the write auto-precharge signal WPCG are input and the third bank group BG3 is activated by the first and second internal bank group addresses IBG<1:2>, the third bank group BG3 may perform a precharge operation after performing a write operation of storing data DATA in a memory cell (not illustrated) that is selected by the first and second internal bank addresses IBA<1:2> and the first and second internal column addresses ICOL<1:2>. When the internal read command IRD and the read auto-precharge signal RPCG are input and the third bank group BG3 is activated by the first and second internal bank group addresses IBG<1:2>, the third bank group BG3 may perform a precharge operation after performing a read operation of outputting data DATA stored in a memory cell (not illustrated) that is selected by the first and second internal bank addresses IBA<1:2> and the first and second internal column addresses ICOL<1:2>.

When the internal write command IWT and the write auto-precharge signal WPCG are input and the fourth bank group BG4 is activated by the first and second internal bank group addresses IBG<1:2>, the fourth bank group BG4 may perform a precharge operation after performing a write operation of storing data DATA in a memory cell (not illustrated) that is selected by the first and second internal bank addresses IBA<1:2> and the first and second internal column addresses ICOL<1:2>. When the internal read command IRD and the read auto-precharge signal RPCG are input and the fourth bank group BG4 is activated by the first and second internal bank group addresses IBG<1:2>, the fourth bank group BG4 may perform a precharge operation after performing a read operation of outputting data DATA stored in a memory cell (not illustrated) that is selected by the first and second internal bank addresses IBA<1:2> and the first and second internal column addresses ICOL<1:2>.

FIG. 22 is a table to assist in the explanation of a chip select signal and command addresses for controlling the operation of the semiconductor system 300.

A logic level combination of the chip select signal CS and the first to ninth command addresses CA<1:9> for performing the write auto-precharge operation may be set based on a case in which the first command address CA<1> is a logic high level H, the second command address CA<2> is a logic low level L, the third command address CA<3> is a logic high level H, the fourth command address CA<4> is a logic high level H, and the fifth command address CA<5> is a logic low level L during a period in which the chip select signal CS is a logic low level L, and the ninth command address CA<9> is a logic low level L during a period in which the chip select signal CS is a logic high level H. Here, the case in which the ninth command address CA<9> is a logic high level H may be set to a general write operation other than the write auto-precharge operation.

A logic level combination of the chip select signal CS and the first to ninth command addresses CA<1:9> for performing the read auto-precharge operation may be set based on a case in which the first command address CA<1> is a logic high level H, the second command address CA<2> is a logic low level L, the third command address CA<3> is a logic high level H, the fourth command address CA<4> is a logic high level H, and the fifth command address CA<5> is a logic high level H during a period in which the chip select signal CS is a logic low level L, and the ninth command address CA<9> is a logic low level L during a period in which the chip select signal CS is a logic high level H. Here, the case in which the ninth command address CA<9> is a logic high level H may be set to a general read operation other than the read auto-precharge operation.

The chip select signal CS and the first to ninth command addresses CA<1:9> for generating the first and second bank group addresses BG<1:2>, the first and second bank addresses BA<1:2>, and the first and second column addresses COL<1:2> may be described as follows.

The sixth command address CA<6> may be set as a bit for generating the first bank address BA<1>, the seventh command address CA<7> may be set as a bit for generating the second bank address BA<2>, the eighth command address CA<8> may be set as a bit for generating the first bank group address BG<1>, and the ninth command address CA<9> may be set as a bit for generating the second bank group address BG<2> during a period in which the chip select signal CS is a logic low level L. The first command address CA<1> may be set as a bit for generating the first column address COL<1>, and the second command address CA<2> may be set as a bit for generating the second column address COL<2> during a period in which the chip select signal CS is a logic high level H. Here, during a period in which the chip select signal CS is a logic high level H, the third to eighth command addresses CA<3:8> may be processed as "don't care" (X), but may be set as bits for generating various internal addresses based on the embodiment.

The semiconductor system 300, in accordance with another embodiment of the disclosure, may serialize addresses based on the time at which the command address CA is input, and then may generate internal addresses by parallelizing the serialized addresses, thereby performing a write auto-precharge operation and a read auto-precharge operation. Also, in the semiconductor system 300, in accordance with another embodiment of the disclosure, by serializing addresses that are input in parallel and then generating internal addresses by parallelizing the serialized addresses, the number of flip-flops for latching and shifting addresses may be reduced, and thus, the area may be reduced.

Figure 23:
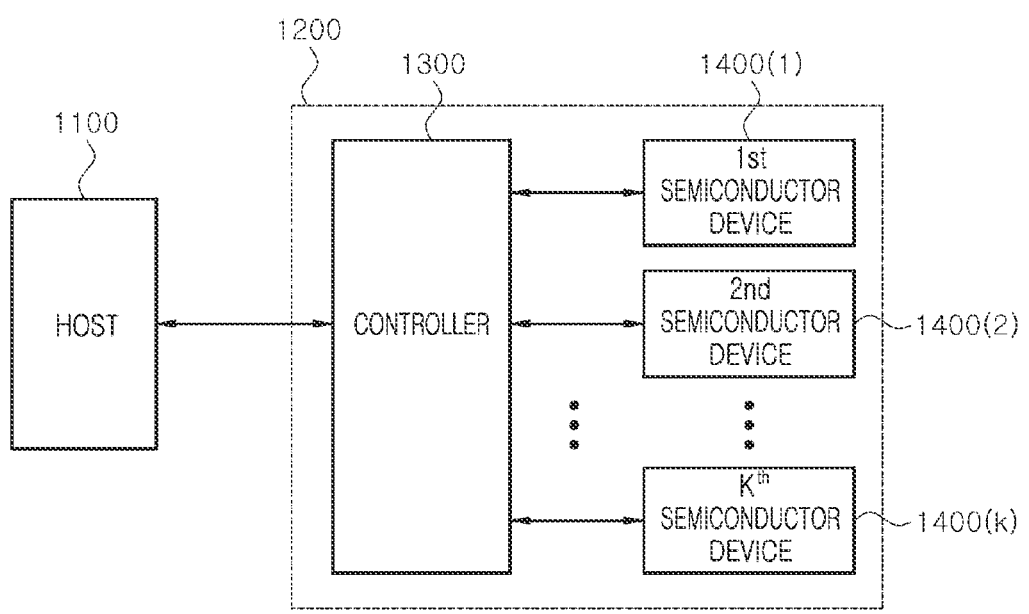
FIG. 23 is a diagram illustrating a configuration of an electronic system in accordance with an embodiment of the disclosure, to which the semiconductor system illustrated in FIGS. 1 to 22 is applied.

FIG. 23 is a block diagram illustrating a configuration of an electronic system 1000 in accordance with an embodiment of the disclosure. As illustrated in FIG. 23, the electronic system 1000 may include a host 1100 and a semiconductor system 1200.

The host 1100 and the semiconductor system 1200 may transmit signals to each other by using an interface protocol. Examples of the interface protocol used between the host 1100 and the semiconductor system 1200 may include MMC (multimedia card), ESDI (enhanced small disk interface), IDE (integrated drive electronics), PCI-E (peripheral component interconnect-express), ATA (advanced technology attachment), SATA (serial ATA), PATA (parallel ATA), SAS (serial attached SCSI), and USB (universal serial bus).

The semiconductor system 1200 may include a controller 1300 and semiconductor devices 1400(k:1). The controller 1300 may control the semiconductor devices 1400(k:1) such that the semiconductor devices 1400(k:1) perform a write auto-precharge operation and a read auto-precharge operation. Each of the semiconductor devices 1400(k:1) may serialize addresses depending on a time when each of a command CMD and a command address CA is input, and then may generate internal addresses by parallelizing the serialized addresses, thereby performing the write auto-precharge operation and the read auto-precharge operation. As each of the semiconductor devices 1400(k:1) serializes addresses that are input in parallel and then generates internal addresses by parallelizing the serialized addresses, the number of flip-flops for latching and shifting addresses may be reduced, and thus, the area may be reduced.

The controller 1300 may be implemented with the controller 110 illustrated in FIG. 1 and the controller 310 illustrated in FIG. 20. Each of the semiconductor devices 1400(k:1) may be implemented with the semiconductor device 120 illustrated in FIG. 1 and the semiconductor device 320 illustrated in FIG. 20. According to an embodiment, each of the semiconductor devices 1400(k:1) may be implemented with one among a DRAM (dynamic random access memory), a PRAM (phase change random access memory), an RRAM (resistive random access memory), an MRAM (magnetic random access memory) and an FRAM (ferroelectric random access memory).

While various embodiments have been described above, it will be understood to those skilled in the art that the embodiments described are by way of example only. Accordingly, the semiconductor device and the semiconductor system performing an auto-precharge operation described herein should not be limited based on the described embodiments.

What is claimed is:

1. A semiconductor device comprising:
a control circuit configured to generate first to fourth shifting rising clocks and first to third shifting falling clocks by shifting a first write command and a second write command that are selectively generated based on an input time of a command in a write auto-precharge operation; and
an internal address generation circuit configured to generate first and second internal bank group addresses, first and second internal bank addresses, and first and second internal column addresses for performing the write auto-precharge operation by serializing and then parallelizing first and second bank group addresses, first and second bank addresses, and first and second column addresses in synchronization with the first to fourth shifting rising clocks and the first to third shifting falling clocks.

2. The semiconductor device according to claim 1, wherein the control circuit comprises:
   a shifting clock generation circuit configured to generate the first to fourth shifting rising clocks and the first to third shifting falling clocks by shifting the first write command and the second write command in synchronization with an internal clock and configured to generate a write shifting signal by shifting the fourth shifting rising clock; and
   a control signal generation circuit configured to generate an internal write command and a write auto-precharge signal for performing the write auto-precharge operation by synthesizing the first write command and the second write command.

3. The semiconductor device according to claim 2, wherein the shifting clock generation circuit comprises:
   a first shift circuit configured to generate the first shifting rising clock based on any one of the first write command and the second write command in synchronization with the internal clock; and
   a second shift circuit configured to generate the second to fourth shifting rising clocks and the first to third shifting falling clocks by shifting the first shifting rising clock in synchronization with the internal clock and configured to generate the write shifting signal by shifting the fourth shifting rising clock.

4. The semiconductor device according to claim 2, wherein the control signal generation circuit comprises:
   a first logic circuit configured to generate the internal write command by synthesizing the first write command and the second write command; and
   a second logic circuit configured to generate the write auto-precharge signal based on the first write command and the second write command when an auto-precharge signal is enabled.

5. The semiconductor device according to claim 1, wherein the internal address generation circuit comprises:
   a serializer configured to serialize the first and second bank group addresses, the first and second bank addresses, and the first and second column addresses based on the first to fourth shifting rising clocks in synchronization with the internal clock and an inverted internal clock and configured to generate a rising address and a falling address by shifting the first and second bank group addresses, the first and second bank addresses, and the first and second column addresses that are serialized; and
   a deserializer configured to generate the first and second internal bank group addresses, the first and second internal bank addresses, and the first and second internal column addresses by parallelizing the rising address and the falling address based on the write shifting signal in synchronization with the internal clock.

6. The semiconductor device according to claim 5, wherein the serializer comprises:
   a first serializer configured to generate the rising address by serializing the first and second bank group addresses, a flag signal, and the first bank address based on the first to fourth shifting rising clocks in synchronization with the internal clock; and
   a second serializer configured to generate the falling address by serializing the second bank address and the first and second column addresses based on the first to third shifting falling clocks in synchronization with the inverted internal clock.

7. The semiconductor device according to claim 6, wherein the first serializer comprises:
   a pre-rising address generation circuit configured to generate a pre-rising address by serializing the first and second bank group addresses, the flag signal, and the first bank address based on the first to fourth shifting rising clocks; and
   a rising address generation circuit configured to generate the rising address by shifting the pre-rising address in synchronization with the internal clock.

8. The semiconductor device according to claim 6, wherein the second serializer comprises:
   a pre-falling address generation circuit configured to generate a pre-falling address by serializing the second bank address and the first and second column addresses based on the first to third shifting falling clocks; and
   a falling address generation circuit configured to generate the falling address by shifting the pre-falling address in synchronization with the internal clock.

9. The semiconductor device according to claim 5, wherein the deserializer comprises:
   a delay clock generation circuit configured to generate first to fourth rising delay clocks and first to third falling delay clocks by shifting the write shifting signal in synchronization with the internal clock when a mode setting signal is enabled and configured to output any one of the fourth rising delay clock and the third falling delay clock as an output control signal based on a delay flag signal; and
   an alignment circuit configured to parallelize the rising address and the falling address in synchronization with the first to fourth rising delay clocks and the first to third falling delay clocks when the mode setting signal is enabled and configured to generate the first and second internal bank group addresses, the first and second internal bank addresses, and the first and second internal column addresses based on the rising address and the falling address, which are parallelized, and based on the output control signal.

10. A semiconductor system comprising:
    a controller configured to output a clock, a command, and an address; and
    a semiconductor device configured to generate a flag signal by detecting an input time of the command, which is input in synchronization with the clock in a write auto-precharge operation based on the command, and configured to generate an internal address for performing the write auto-precharge operation by serializing the address and then parallelizing the flag signal and the serialized address.

11. The semiconductor system according to claim 10, wherein the semiconductor device comprises:
    a flag signal generation circuit configured to generate the flag signal by detecting generation times of a first write command and a second write command that are generated based on an input time of the command;
    a control circuit configured to generate first to fourth shifting rising clocks and first to third shifting falling clocks by shifting the first write command and the second write command; and
    an internal address generation circuit configured to generate the internal address by serializing the address in synchronization with the first to fourth shifting rising clocks and the first to third shifting falling clocks and then parallelizing the flag signal and the serialized address.

12. The semiconductor system according to claim 11, wherein the flag signal generation circuit generates the flag signal, which is disabled, when the first write command that is synchronized with an internal clock is input, and
wherein the flag signal generation circuit generates the flag signal, which is enabled, when the second write command that is synchronized with an inverted internal clock is input.

13. The semiconductor system according to claim 11, wherein the control circuit comprises:
a shifting clock generation circuit configured to generate the first to fourth shifting rising clocks and the first to third shifting falling clocks by shifting the first write command and the second write command in synchronization with the internal clock and configured to generate a write shifting signal by shifting the fourth shifting rising clock; and
a control signal generation circuit configured to generate an internal write command and a write auto-precharge signal for performing the write auto-precharge operation by synthesizing the first write command the second write command.

14. The semiconductor system according to claim 13, wherein the shifting clock generation circuit comprises:
a first shift circuit configured to generate the first shifting rising clock based on any one of the first write command and the second write command in synchronization with the internal clock; and
a second shift circuit configured to generate the second to fourth shifting rising clocks and the first to third shifting falling clocks by shifting the first shifting rising clock in synchronization with the internal clock and configured to generate the write shifting signal by shifting the fourth shifting rising clock.

15. The semiconductor system according to claim 14, wherein the control signal generation circuit comprises:
a first logic circuit configured to generate the internal write command by synthesizing the first write command and the second write command; and
a second logic circuit configured to generate the write auto-precharge signal based on the first write command and the second write command when an auto-precharge signal is enabled.

16. The semiconductor system according to claim 11, wherein the internal address generation circuit comprises:
an internal address generation circuit configured to generate first and second internal bank group addresses, first and second internal bank addresses, and first and second internal column addresses by serializing and then parallelizing first and second bank group addresses, first and second bank addresses, and first and second column addresses that are generated from the address and the flag signal, wherein the internal address comprises the first and second internal bank group addresses, the first and second internal bank addresses, and the first and second internal column addresses.

17. The semiconductor system according to claim 11, wherein the internal address generation circuit comprises:
a serializer configured to serialize the first and second bank group addresses, the first and second bank addresses, and the first and second column addresses based on the first to fourth shifting rising clocks in synchronization with the internal clock and the inverted internal clock and configured to generate a rising address and a falling address by shifting the first and second bank group addresses, the first and second bank addresses, and the first and second column addresses which are serialized; and
a deserializer configured to generate the first and second internal bank group addresses, the first and second internal bank addresses, and the first and second internal column addresses by parallelizing the rising address and the falling address based on the write shifting signal in synchronization with the internal clock.

18. The semiconductor system according to claim 17, wherein the serializer comprises:
a first serializer configured to generate the rising address by serializing the first and second bank group addresses, the flag signal, and the first bank address based on the first to fourth shifting rising clocks in synchronization with the internal clock; and
a second serializer configured to generate the falling address by serializing the second bank address and the first and second column addresses based on the first to third shifting falling clocks in synchronization with the inverted internal clock.

19. The semiconductor system according to claim 18, wherein the first serializer comprises:
a pre-rising address generation circuit configured to generate a pre-rising address by serializing the first and second bank group addresses, the flag signal, and the first bank address based on the first to fourth shifting rising clocks; and
a rising address generation circuit configured to generate the rising address by shifting the pre-rising address in synchronization with the internal clock.

20. The semiconductor system according to claim 18, wherein the second serializer comprises:
a pre-falling address generation circuit configured to generate a pre-falling address by serializing the second bank address and the first and second column addresses based on the first to third shifting falling clocks; and
a falling address generation circuit configured to generate the falling address based on shifting the pre-falling address in synchronization with the internal clock.

21. The semiconductor system according to claim 17, wherein the deserializer comprises:
a delay clock generation circuit configured to generate first to fourth rising delay clocks and first to third falling delay clocks by shifting the write shifting signal in synchronization with the internal clock when a mode setting signal is enabled and configured to output any one of the fourth rising delay clock and the third falling delay clock as an output control signal based on a delay flag signal; and
an alignment circuit configured to parallelize the rising address and the falling address in synchronization with the first to fourth rising delay clocks and the first to third falling delay clocks when the mode setting signal is enabled and configured to generate the first and second internal bank group addresses, the first and second internal bank addresses, and the first and second internal column addresses based on the rising address and the falling address, which are parallelized, and based on the output control signal.

22. A semiconductor system comprising:
a controller configured to output a clock, a chip select signal and a command address; and
a semiconductor device configured to generate first and second bank group addresses and first and second bank addresses from the command address that is input during a period in which the chip select signal is a first logic level when the command address that is input during the period in which the chip select signal is the first logic level is a logic level combination for performing a write auto-precharge operation, configured to generate first and second column addresses from the command address that is input during a period in which the chip select signal is a second logic level, and configured to generate first and second internal bank group addresses, first and second internal bank addresses, and first and second internal column addresses by serializing and then parallelizing the first and second bank group addresses, the first and second bank addresses, and the first and second column addresses.

23. The semiconductor system according to claim 22, wherein the semiconductor device comprises:
a command decoder configured to generate a first write command and a second write command that are enabled in synchronization with any one of an internal clock and an inverted internal clock when the command address that is input during a period in which the chip select signal is the first logic level is a logic level combination for performing the write auto-precharge operation;

an address input circuit configured to generate the first and second bank group addresses and the first and second bank addresses from the command address that is input during a period in which the chip select signal is the first logic level and configured to generate the first and second column addresses from the command address that is input during a period in which the chip select signal is a second logic level;

a control circuit configured to generate first to fourth shifting rising clocks and first to third shifting falling clocks by shifting the first write command and the second write command; and an internal address generation circuit configured to generate the first and second internal bank group addresses, the first and second internal bank addresses, and the first and second internal column addresses, by serializing and then parallelizing the first and second bank group addresses, the first and second bank addresses, and the first and second column addresses in synchronization with the first to fourth shifting rising clocks and the first to third shifting falling clocks.

* * * * *